(12) United States Patent
Dodd et al.

(10) Patent No.: US 9,358,567 B2
(45) Date of Patent: Jun. 7, 2016

(54) MICROFLUIDIC SYSTEM WITH SINGLE DRIVE SIGNAL FOR MULTIPLE NOZZLES

(71) Applicant: STMicroelectronics, Inc., Coppell, TX (US)

(72) Inventors: Simon Dodd, West Linn, OR (US); Joe Scheffelin, Poway, CA (US); Dave Hunt, San Diego, CA (US); Matt Giere, San Diego, CA (US); Dana Gruenbacher, Fairfield, OH (US); Faiz Sherman, Mason, OH (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/310,886

(22) Filed: Jun. 20, 2014

(65) Prior Publication Data

US 2015/0367373 A1 Dec. 24, 2015

(51) Int. Cl.
*B05B 17/06* (2006.01)
*H05K 1/11* (2006.01)
*H05K 1/18* (2006.01)
*H05K 1/02* (2006.01)

(52) U.S. Cl.
CPC .......... *B05B 17/0607* (2013.01); *H05K 1/0212* (2013.01); *H05K 1/111* (2013.01); *H05K 1/181* (2013.01); *Y10T 29/49119* (2015.01)

(58) Field of Classification Search
CPC ............... B41J 2/04541; B41J 2/04543; B41J 2/04563; B41J 2/04573; B41J 2/0458
USPC ...................................................... 347/50–58
See application file for complete search history.

(56) References Cited

U.S. PATENT DOCUMENTS

2002/0005878 A1* 1/2002 Moon et al. .................... 347/58

* cited by examiner

*Primary Examiner* — Manish S Shah
*Assistant Examiner* — Roger W Pisha, II
(74) *Attorney, Agent, or Firm* — Seed Intellectual Property Law Group, PLLC

(57) ABSTRACT

The present disclosure is directed to a microfluidic die that includes a plurality of heaters above a substrate, a plurality of chambers and nozzles above the heaters, a plurality of first contacts coupled to the heaters, and a plurality of second contacts coupled to the heaters. The plurality of second contacts are coupled to each other and coupled to ground. The die includes a plurality of contact pads, a first signal line coupled to the plurality of second contacts and to a first one of the plurality of contact pads, and a plurality of second signal lines, each second signal line being coupled to one of the plurality of first contacts, groups of the second signal lines being coupled together to drive a group of the plurality of heaters with a single signal, each group of the second signal lines being coupled to a remaining one of the plurality of contact pads.

18 Claims, 19 Drawing Sheets

MICROFLUIDIC SYSTEM WITH SINGLE DRIVE SIGNAL FOR MULTIPLE NOZZLES

BACKGROUND

1. Technical Field

The present disclosure is directed to a microfluidic system configured to eject fluids from a plurality of nozzles driven in groups, where each nozzle of one group is driven with a single drive signal.

2. Description of the Related Art

Microfluidic systems include a variety of ejection techniques that cause fluid to exit nozzles of a die. These techniques includes thermal, piezo, and ultrasonic, to name a few. One example is thermal inkjet print heads, which have precise nozzle control to deliver a drop of ink onto a piece of paper in a very precise location. In order to achieve this precision, control of each nozzle is associated with a single, dedicated electrical connection.

Many of these systems have such dedicated external electrical connections for each nozzle in the die, such that if there are N nozzles, there are N+1 external electrical connections. The extra connection being coupled to ground. The external electrical connections may be a flexible conduit of wires that couple to bond pads of the die. These systems also often have a dedicated internal electrical connection on the die for each nozzle, each internal electrical connection being coupled to one of the bond pads of the die. These arrangements can be referred to as the direct drive of each nozzle. These die tend to be large because of the number of bond pads and internal electrical connections utilized.

More complicated ejection systems include rows and columns of nozzles that are controlled by active circuitry formed in the same substrate as the nozzles. The active circuitry could include NMOS transistors that multiplex the rows and columns to allow for more nozzles to be controlled by a single one of the bond pads.

Further involved systems integrate CMOS based logic to create clock systems to change the bond pad to nozzle ratio for each die. In order to form the CMOS based logic on the die, the die becomes extremely complicated and costly to manufacture. Layers upon layers of thin films are added to modify the bond pad to nozzle ratio.

BRIEF SUMMARY

The present disclosure is directed to a microfluidic delivery system that is configured to eject a fluid from multiple nozzles with a single drive signal. The die may have groups of heaters coupled to a single contact pad such that each heater of the group receives the same drive signal. Alternatively, each heater may have a separate contact pad on the die, where groups of the contact pads are coupled to a single signal line on a printed circuit board or a flexible interconnect. In this arrangement the group of contacts will drive their respective heaters simultaneously.

This direct drive system of multiple nozzles ejecting fluid simultaneously creates simplicity in the arrangement of electrical traces on the die, on the circuit board, or on both. This can reduce cost while reducing the overall footprint of the microfluidic delivery system.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
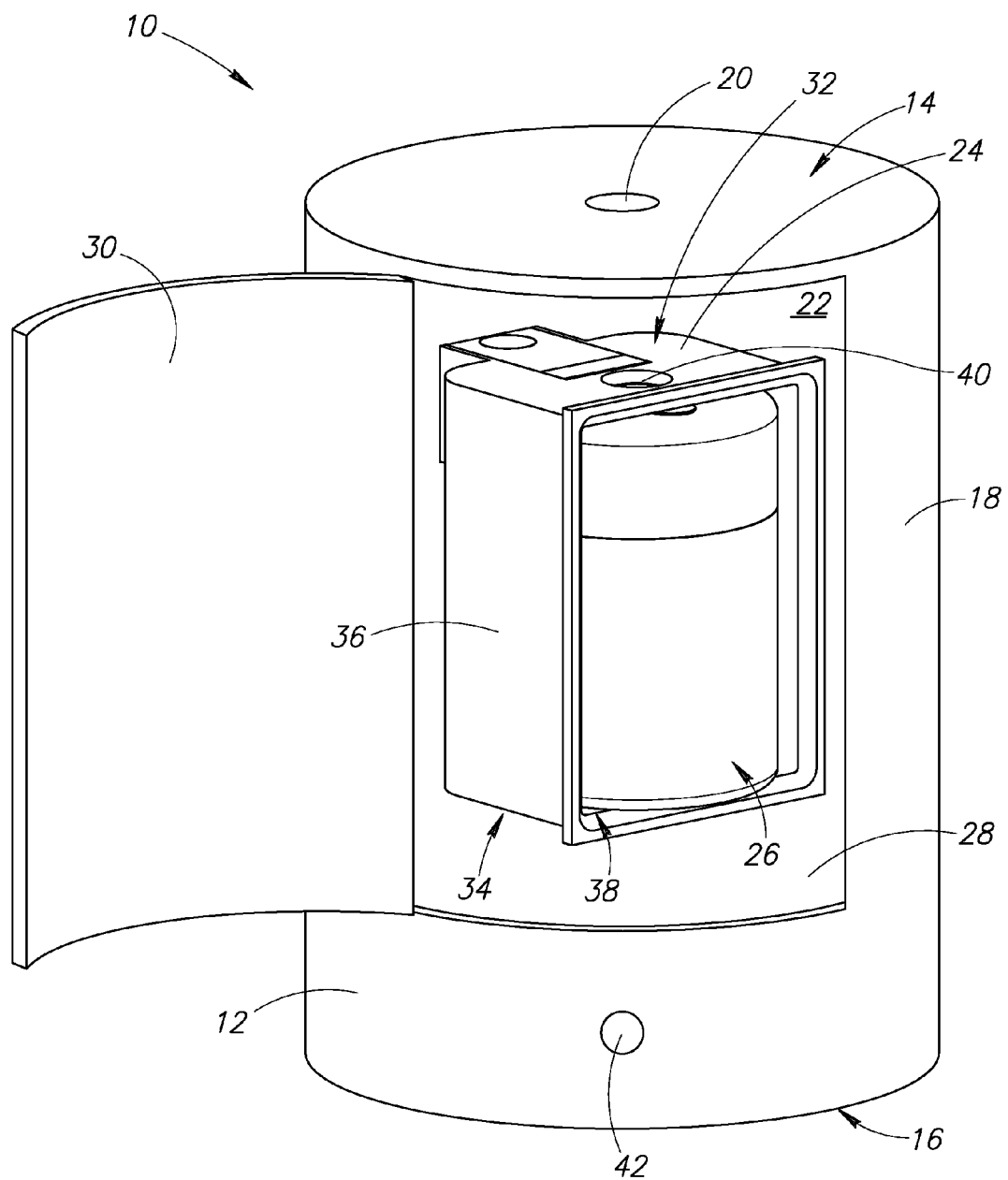
FIG. 1 is a schematic isometric view of a microfluidic delivery system in accordance with one embodiment.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

In the drawings, identical reference numbers identify similar elements or acts. The size and relative positions of elements in the drawings are not necessarily drawn to scale.

FIG. 1 illustrates a microfluidic delivery system 10 formed in accordance with one embodiment of the disclosure. The microfluidic delivery system 10 is directed to ejecting any number of fluids in a vertical or angled manner from a housing 12. The housing 12 has an upper surface 14, a lower surface 16, and a body portion 18 between the upper and lower surfaces. The upper surface of the housing 12 includes a first hole 20 that places an environment external to the housing 12 in fluid communication with an interior portion 22 of the housing 12. The interior portion 22 of the housing 12 includes a holder member 24 that holds a removable microfluidic refill cartridge 26. As will be explained below, the microfluidic delivery system 10 is configured to deliver fluid from within the microfluidic refill cartridge 26 to the environment external to the housing 12.

Access to the interior portion 22 of the housing is provided by an opening 28 in the body portion 18 of the housing 12, which can be closed by a cover or door 30 of the housing 12. The holder member 24 includes an upper surface 32 and a lower surface 34 that are coupled together by one or more sidewalls 36 and has an open side 38 through which the microfluidic refill cartridge 26 can slide in and out. The upper surface 32 of the holder member 24 includes a second hole 40 that is aligned with the first hole 20 of the housing 12. The holder member 24 holds the microfluidic refill cartridge 26 in position.

The housing 12 may include external electrical connection elements for coupling with an external power source. The external electrical connection elements may be a plug configured to be plugged into an electrical outlet or battery terminals. Internal electrical connections couple the external electrical connection elements to the holder member 24 to provide power to the microfluidic refill cartridge. The housing 12 may include a power switch 42 on a front of the housing 12.

Figure 2A:
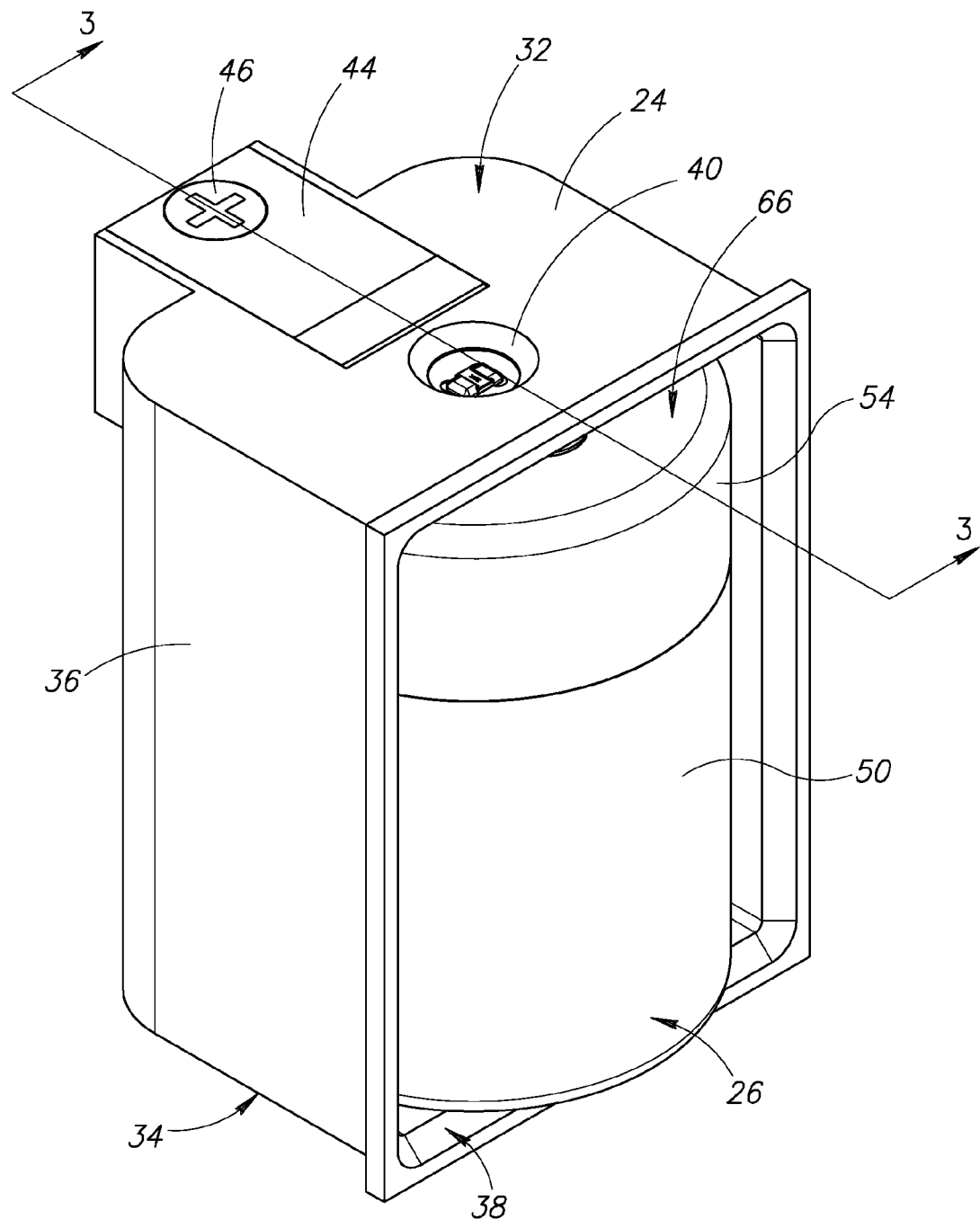
FIGS. 2A-2B are schematic isometric views of a microfluidic refill cartridge and a holder of the microfluidic system of FIG. 1.
Figure 2B:
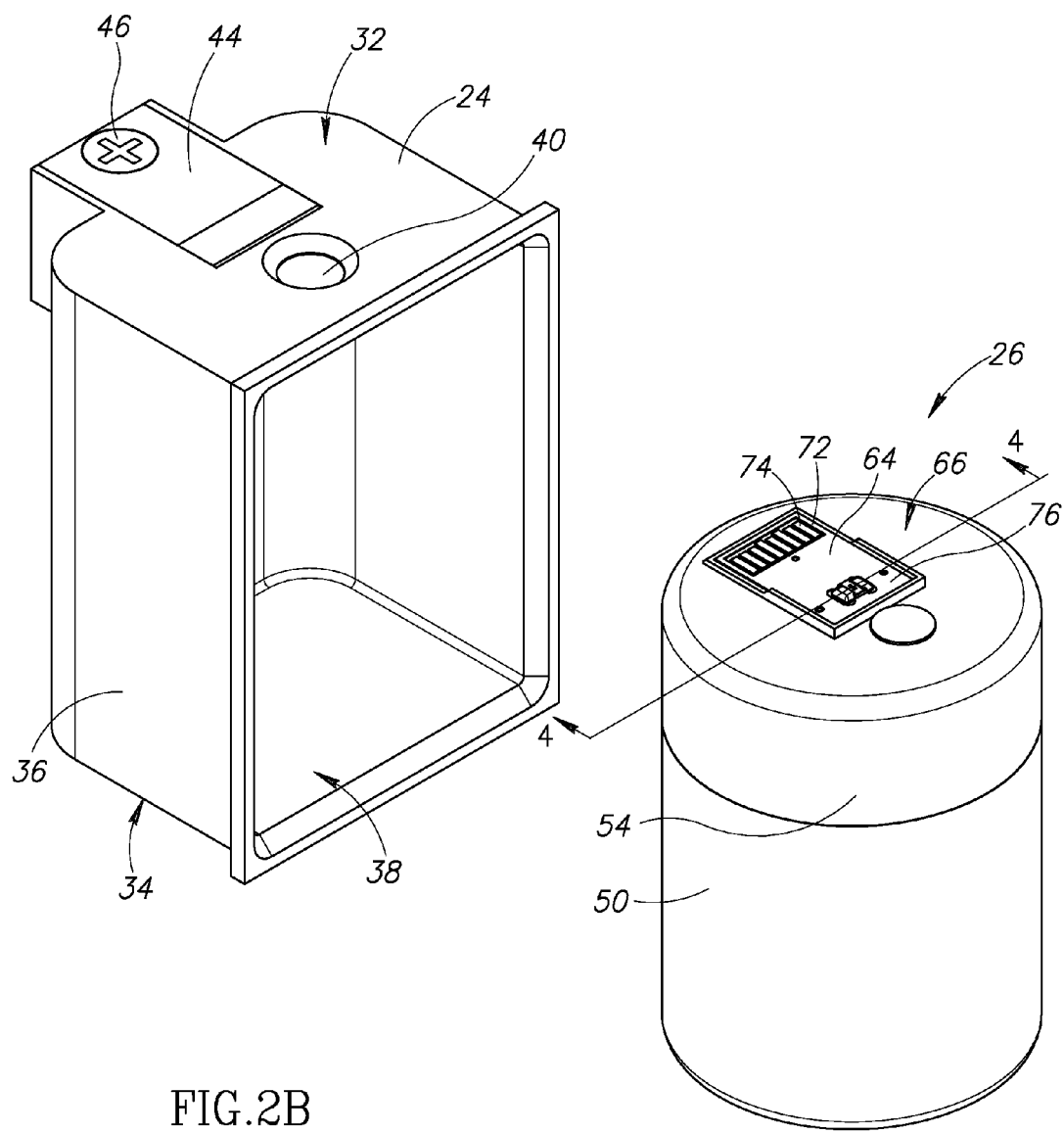

FIG. 2A shows the microfluidic refill cartridge 26 in the holder member 24 without the housing 12, and FIG. 2B shows the microfluidic refill cartridge 26 removed from the holder member 24. A first circuit board 44 is coupled to the upper surface 32 of the holder member by a screw 46. The first circuit board 44 includes electrical contacts 48 that electrically couple to the microfluidic refill cartridge 26. The electrical contacts 48 of the first circuit board 44 are in electrical communication with the internal and external electrical connection elements.

Figure 3:
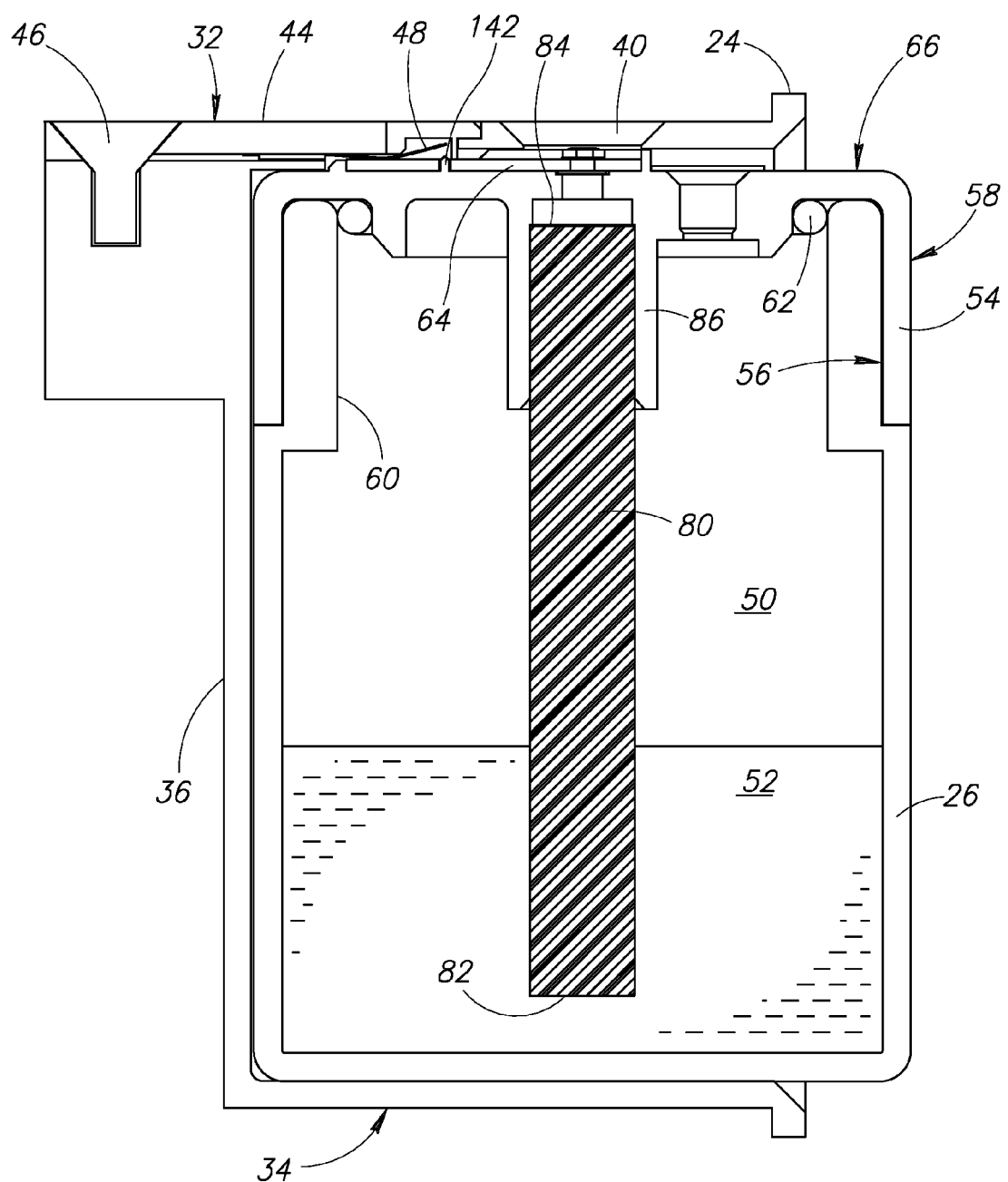
FIG. 3 is a cross-section schematic view of line 3-3 in FIG. 2A.

The microfluidic refill cartridge 26 includes a reservoir 50 for holding a fluid 52 (see FIG. 3). The reservoir 50 may be any shape, size, or material configured to hold any number of different types of fluid. The fluid held in the reservoir may be any liquid composition. In one embodiment, the fluid is an oil, such as a scented oil. In another embodiment, the fluid is water. It may also be alcohol, a perfume, a biological material, a polymer for 3-D printing, or other fluid.

A lid 54, having an inner surface 56 and an outer surface 58, is secured to an upper portion 60 of the reservoir to cover the reservoir. The lid 54 may be secured to the reservoir in a variety of ways known in the art. Between the lid 54 and the reservoir 50 there may be an o-ring 62 for forming a seal to prevent fluid from flowing.

Figure 5A:
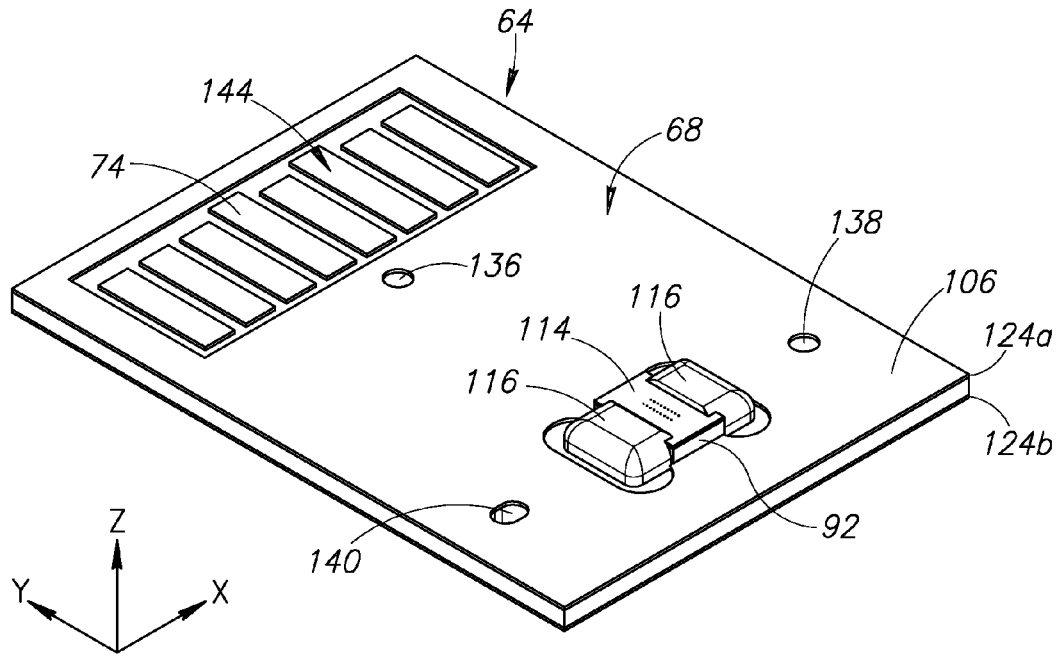
FIGS. 5A-5B are schematic isometric views of a microfluidic delivery member in accordance with an embodiment.
Figure 5B:
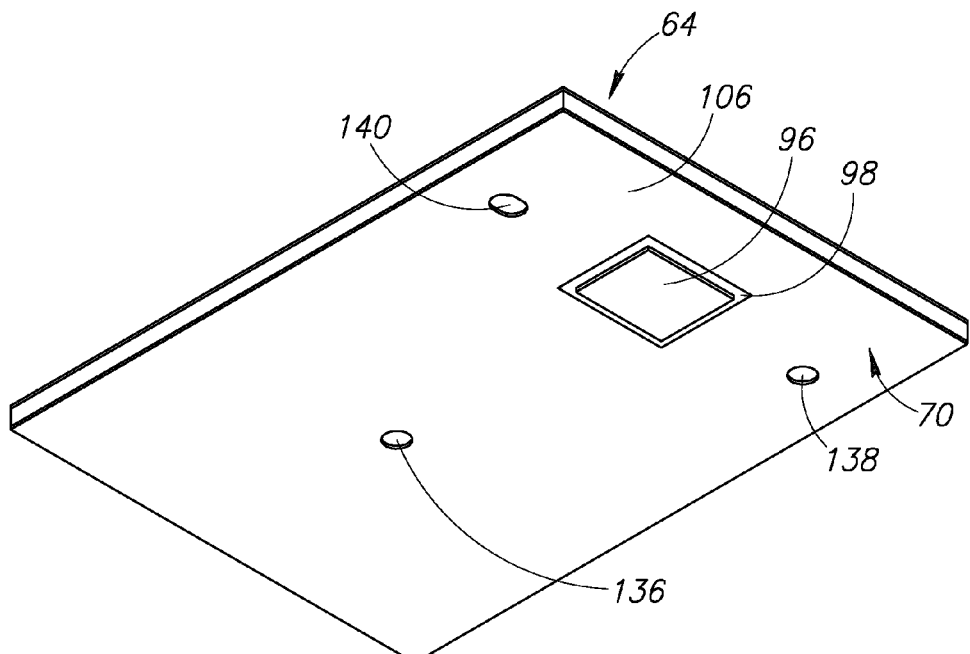

A microfluidic delivery member 64 is secured to an upper surface 66 of the lid 54 of the microfluidic refill cartridge 26. The microfluidic delivery member 64 includes an upper surface 68 and a lower surface 70 (see FIGS. 5A-5C). A first end 72 of the upper surface 68 includes electrical contacts 74 for coupling with the electrical contacts 48 of the first circuit board 44 when placed in the holder member 24. A second end 76 of the microfluidic delivery member 64 includes a part of a fluid path that passes through an opening 78 for delivering fluid.

FIG. 3 is a cross-section view of the microfluidic refill cartridge 26 in the holder member 24 along the line 3-3 shown in FIG. 2A. Inside the reservoir 50 is a fluid transport member 80 that has a first end 82 in the fluid 52 in the reservoir 50 and a second end 84 that is above the fluid. The second end 84 of the transport member 80 is located below the microfluidic delivery member 64. The fluid transport member 80 delivers fluid from the reservoir 50 to the microfluidic delivery member 64.

The fluid transport member 80 is configured to allow fluid in the reservoir 50 to travel from the first end 82 to the second end 84, such as with capillary action against gravity. Fluid can travel by wicking, diffusion, suction, siphon, vacuum, or other mechanism. The fluid transport member 80 may be in the form of fibers or sintered beads.

Figure 4:
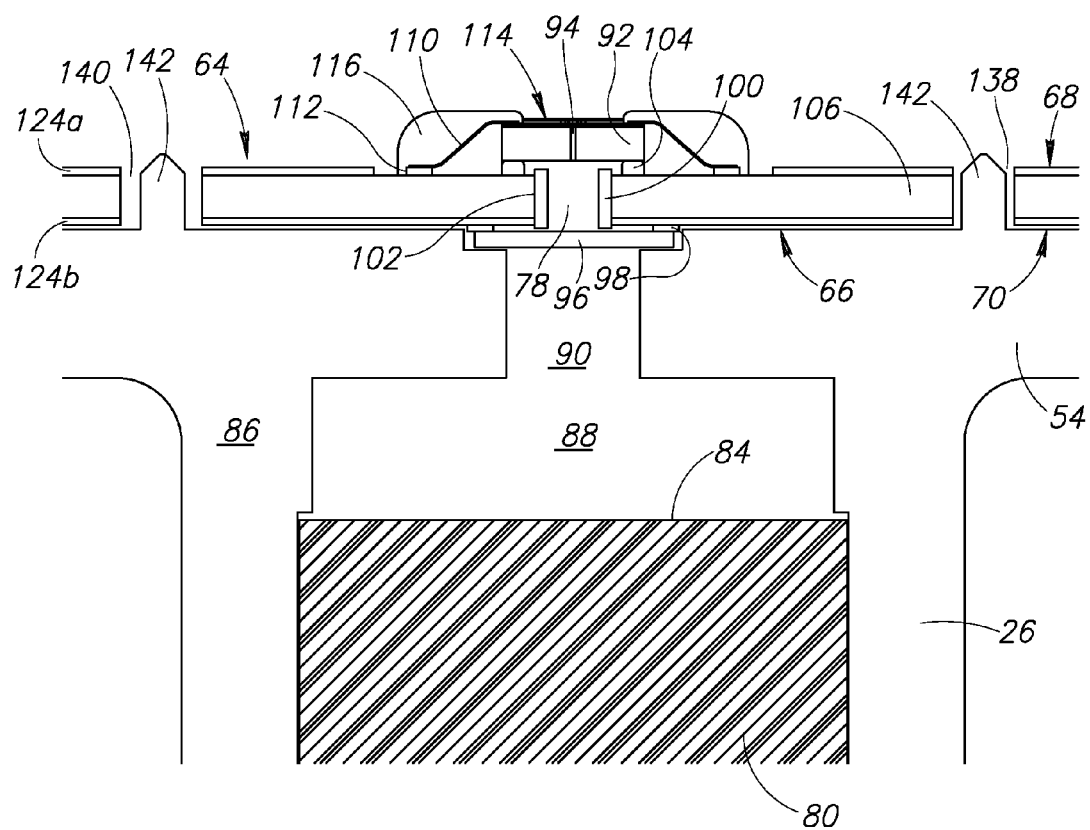
FIG. 4 is a cross-section schematic view of line 4-4 in FIG. 2B.

As best shown in FIG. 4, the second end 84 of the fluid transport member 80 is surrounded by a transport cover 86 that extends from the inner surface of the lid 54. The second end 84 of the fluid transport member 80 and the transport cover 86 form a chamber 88. The chamber 88 may be substantially sealed between the transport cover 86 and the fluid transport member 80 to prevent air from the reservoir 50 from entering the chamber 88.

Above the chamber 88 is a first through hole 90 in the lid 54 that fluidly couples the chamber 88 above the second end 84 of the fluid transport member 80 to the fluid path through the opening 78 of the microfluidic delivery member 64. The microfluidic delivery member 64 is secured to the lid 54 above the first through hole 90 of the lid and receives fluid.

As is shown in FIGS. 4 and 5A-5C, the microfluidic delivery member 64 may include a printed circuit board 106 that carries a semiconductor die 92. The printed circuit board 106 includes first and second circular openings 136, 138 and an oval opening 140. Prongs 142 from the lid 54 extend through the openings 136, 138, 140 to ensure the board 106 is aligned with the fluid path appropriately. The oval opening 140 interacts with a wider prong so that the board 106 can only fit onto the lid 54 in one arrangement.

The upper and lower surfaces of the board may be coated with a solder mask 124a, 124b. Openings in the solder mask 124 may be provided where contact pads 112 of the die 92 are positioned on the circuit board 106 or at the first end 72 where the contacts 74 are formed. The solder mask 124 may be used as a protective layer to cover electrical traces 75 carried by the board 106 that couple the contact pads 112 of the die 92 to the electrical contacts 74, which couple the contact pads 112 to the external power source.

The printed circuit board 106 (PCB) is a rigid planar circuit board, having the upper and lower surfaces 68, 70. The circuit board 106 includes one or more layers of insulative and conductive materials. In one embodiment, the substrate 107 includes an FR4 PCB 106, a composite material composed of woven fiberglass with an epoxy resin binder that is flame resistant. In other embodiments, the substrate 107 includes ceramic, glass or plastic. In an alternative embodiment, instead of having a rigid circuit board, a flexible interconnect may be used to couple the die to electrical connections in the housing.

Figure 13:
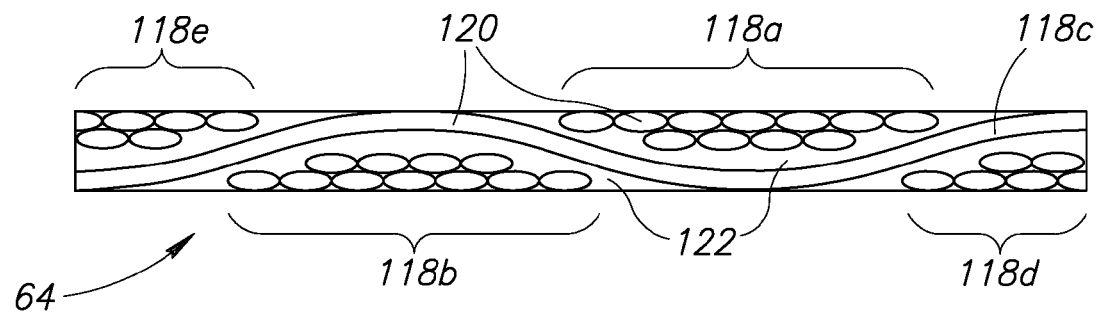
FIG. 13 is an enhanced cross-section view through a printed circuit board according to an embodiment.
Figure 14:
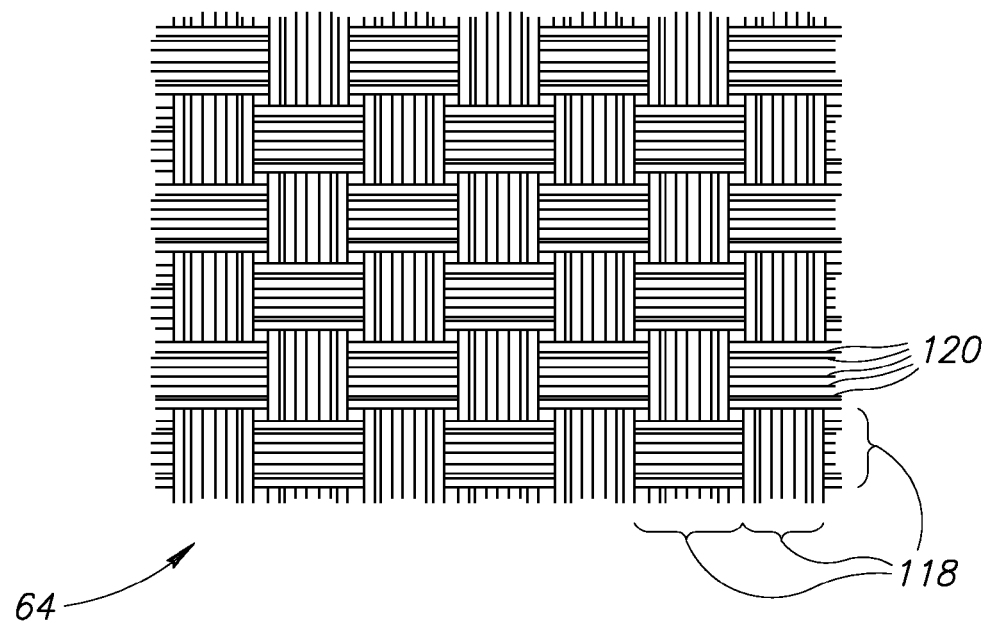
FIG. 14 is an enhanced top down view of a plurality of woven fibers in the printed circuit board of FIG. 13.

As is further shown in FIGS. 13 and 14, an FR4 PCB 106 includes a plurality of bundles 118 of fibers 120 that are woven together. FIGS. 13 and 14 are enhanced views of an FR4 PCB, such as the circuit board 106 described above. Some of the bundles 118, such as bundle 118a and bundle 118b, are adjacent to each other and extend in and out of FIG. 13. Other bundles, such as bundle 118c, are transverse to bundles 118a and 118b and extend left to right in FIG. 13. Each bundle alternates over and under adjacent transverse bundles. For example, bundle 118c is over bundle 118d, under bundle 118a, over bundle 118b, and under bundle 118e.

Each bundle 118 includes a plurality of fibers 120 or strands of flexible resilient material. In one embodiment, the fibers 120 are elongated fiberglass strands. FIG. 13 shows eleven fibers 120 per bundle; however, the number of fibers 120 is illustrative and any number of fibers 120 may be utilized to achieve the PCB 106.

The bundles 118 are encased in a support material 122 that makes the composite material circuit board 106 rigid enough to support the die 92. The support material 122 may be a polymer or other material sufficient to bind the fibers 120 of the bundles 118 in the woven pattern. The support material 122 may be applied to the fiber bundles 118 in a liquid form so that the support material fills in spaces between the woven bundles. Alternatively, the woven bundles 118 of fibers 120 are placed between two polymer sheets and heated to form the support material. In one embodiment, the heat causes the polymer sheets to flow between the fibers 120 and bond to each other to form the support material 122. In another embodiment, the polymer sheets form a laminate of the support material over the bundles of fibers. Once solidified, the support material 122 is not brittle, which minimizes the risk of cracking during the packaging.

FIG. 14 is a top down view of the woven fibers 120 of the circuit board 106 arranged in the plurality of bundles 118. The over and under woven pattern forms a strong yet flexible material for supporting the die 92 and for simplifying the electrical connection to the external power source.

In one embodiment, the fibers 120 are flame resistant woven fiberglass cloth and the support material is a flame resistant epoxy resin binder; for example, an FR-4 grade reinforced glass epoxy laminate sheet having the woven bundles of fibers. FR-4 grade is a high-pressure thermoset plastic laminate with good mechanical strength to weight ratios that maintains its mechanical qualities in dry and humid conditions. Fiberglass has high tensile strength with flexibility.

Returning to FIGS. 5A-5C, the fluid delivery system 64 is configured to provide a single, easily accessible and removable circuit board 106. In particular, the circuit board 106 includes all electrical connections, the contacts 74, the traces 75, and the contact pads 112, on the upper surface 68 of the board 106. For example, a top surface 144 of the electrical contacts 74 that couple to the housing are parallel to an x-y plane. The upper surface 68 of the board 106 is also parallel to the x-y plane. In addition, a top surface 146 of a nozzle plate 132 of the die 92 is also parallel to the x-y plane. The contact pads 112 also have a top surface that is parallel to the x-y plane. By forming each of these features to be in parallel planes, the complexity of the board 106 is reduced and it is easier to manufacture. In addition, this allows nozzles 130 to eject the fluid vertically (directly up or at an angle) away from the housing, such as could be used for spraying scented oils into a room as air freshener. This arrangement could create a scented plume 5-10 cm high.

On the lower surface of the board, the filter 96 may be provided to separate the opening 78 of the board 106 from the chamber 88 at the lower surface of the PCB. The filter 96 is configured to prevent at least some of the particles from passing through the opening to prevent clogging of the nozzles 130 of the die 92. The filter 96 is attached to the bottom surface with the adhesive material 98. The adhesive material 98 may be an adhesive material that does not readily dissolve by the fluid in the reservoir 50. Alternatively, the adhesive material 98 may be a first mechanical spacer 98.

The semiconductor die 92 is secured to the upper surface of the board above the opening 78 by any adhesive material. The adhesive material may be the same or different from the adhesive material used to secure the filter 96 to the microfluidic delivery member 64.

Figure 5C:
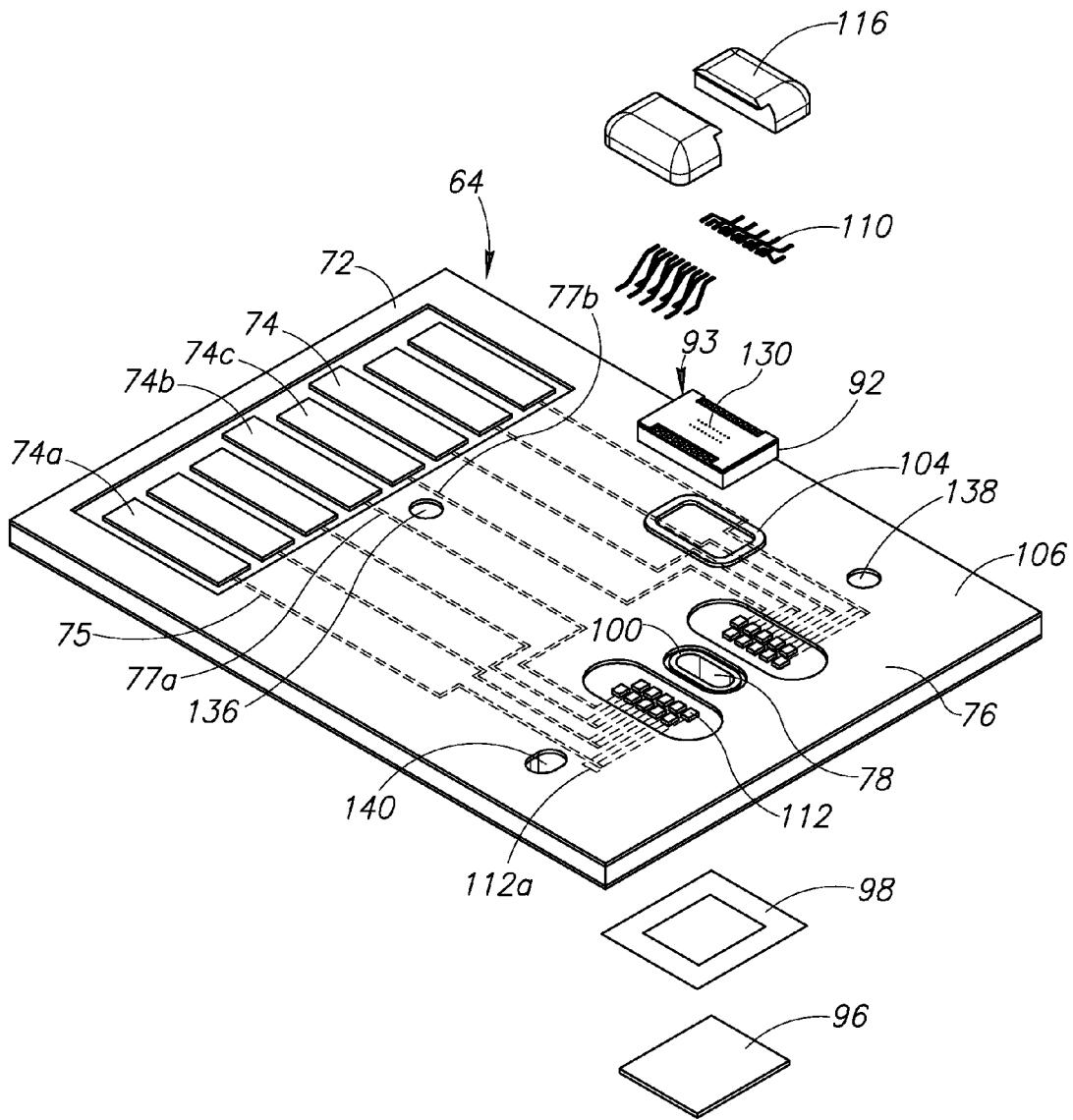
FIG. 5C is an exploded view of FIG. 5A.

The opening 78 may be formed as an oval, as is illustrated in FIG. 5c; however, other shapes are contemplated depending on the application. The opening 78 exposes sidewalls 102 of the board 106. If the board 106 is an FR4 PCB, the bundles of fibers would be exposed by the opening. These sidewalls are susceptible to fluid, and thus a liner 100 is included to cover and protect the sidewalls. If fluid enters the sidewalls, the board could begin to deteriorate, cutting short the life span of this product.

The liner 100 is configured to protect the board from all fluids that an end user may select to eject through the die 92. For example, if the die 92 is used to eject scented oils from the housing, the liner 100 is configured to protect the sidewalls of the board 106 from any damage that could be caused by the scented oils. The liner 100 prolongs the life of the board 106 so that an end user can reuse the housing and the die 92 again and again with refillable or replaceable fluid cartridges.

These oils have different chemical properties than typical ink used with inkjet printers. Accordingly, the prior inkjet print heads used very expensive, very specific materials to prevent the ink from damaging the components that support the ink ejection process, such as the reservoir 50. In the present disclosure, common materials, such as an FR4 board, can be utilized to create a sophisticated, but cost effective system. The liner 100 provides a protective coating to allow the cost effective FR4 board to be utilized in this system. In one embodiment, the liner is gold, however, in other embodiments the liner may be silicon nitride, other oxides, silicon carbide, or other metals, such as tantalum or aluminum.

The liner 100 in FIGS. 4 and 5C includes a vertical member that is adhered to the sidewall 102. In other embodiments, the liner may include top and bottom extensions that overlap the upper and lower surfaces of the board, such that the liner includes corners that wrap around the exposed corners formed by the sidewalls and the opening. In one embodiment, the liner is a metal material, such as gold. In other embodiments, the liner is an inert material, which is less likely to interact with a fluid selected for use in the cartridge.

A second mechanical spacer 104 separates a bottom surface 108 of the die 92 from the upper surface 68 of the printed circuit board 106. An encapsulant 116 covers the contact pads 112 and leads 110, while leaving a central portion 114 of the die exposed.

Figure 6A:
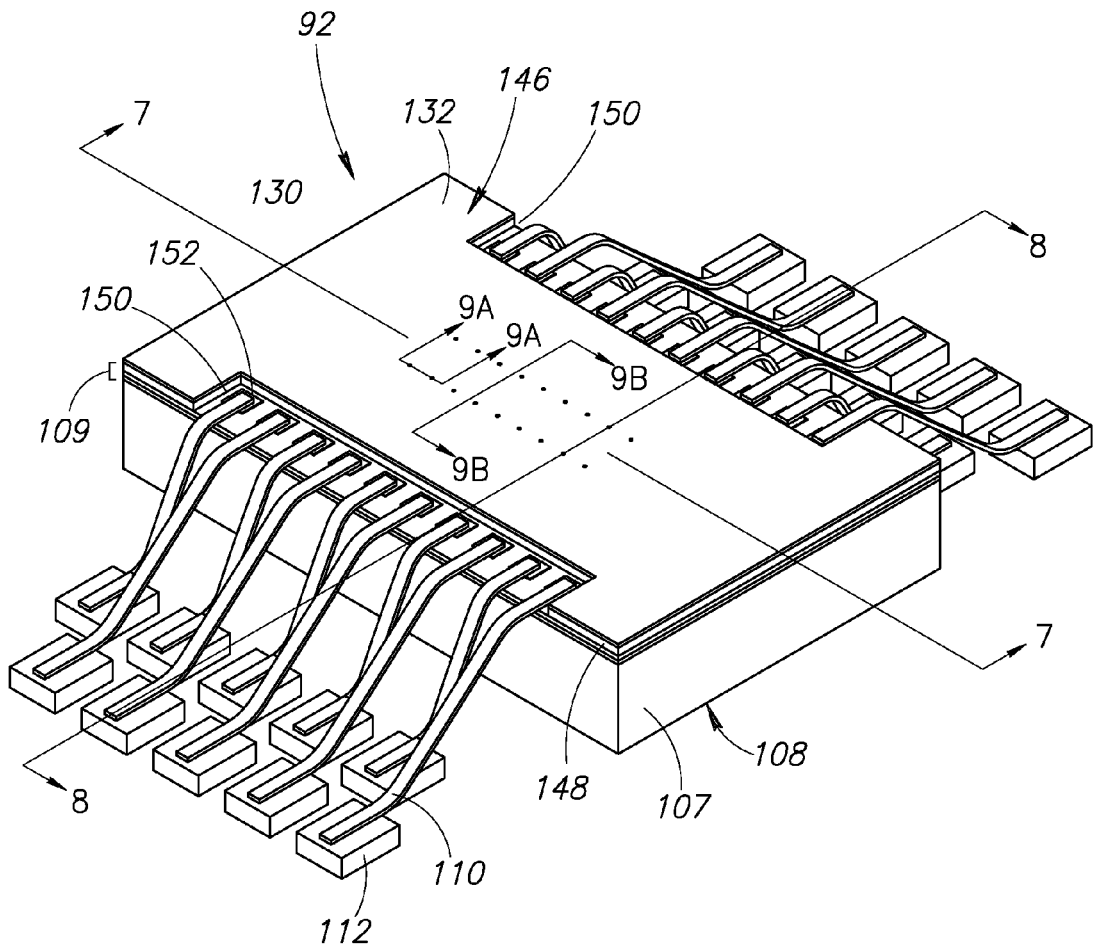
FIGS. 6A-6C are schematic isometric views of a microfluidic die at various layers in accordance with another embodiment.
Figure 6B:
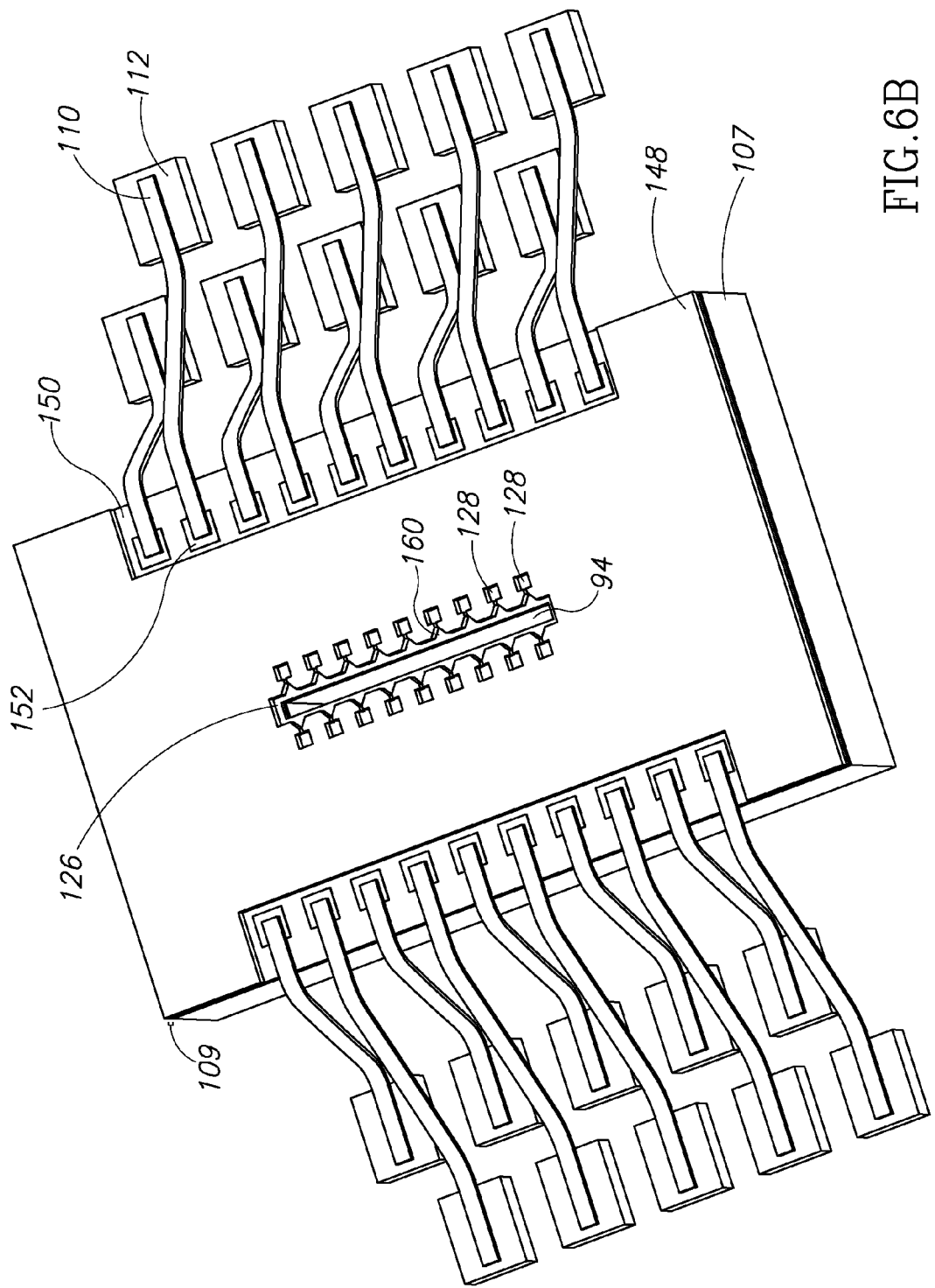
Figure 6C:
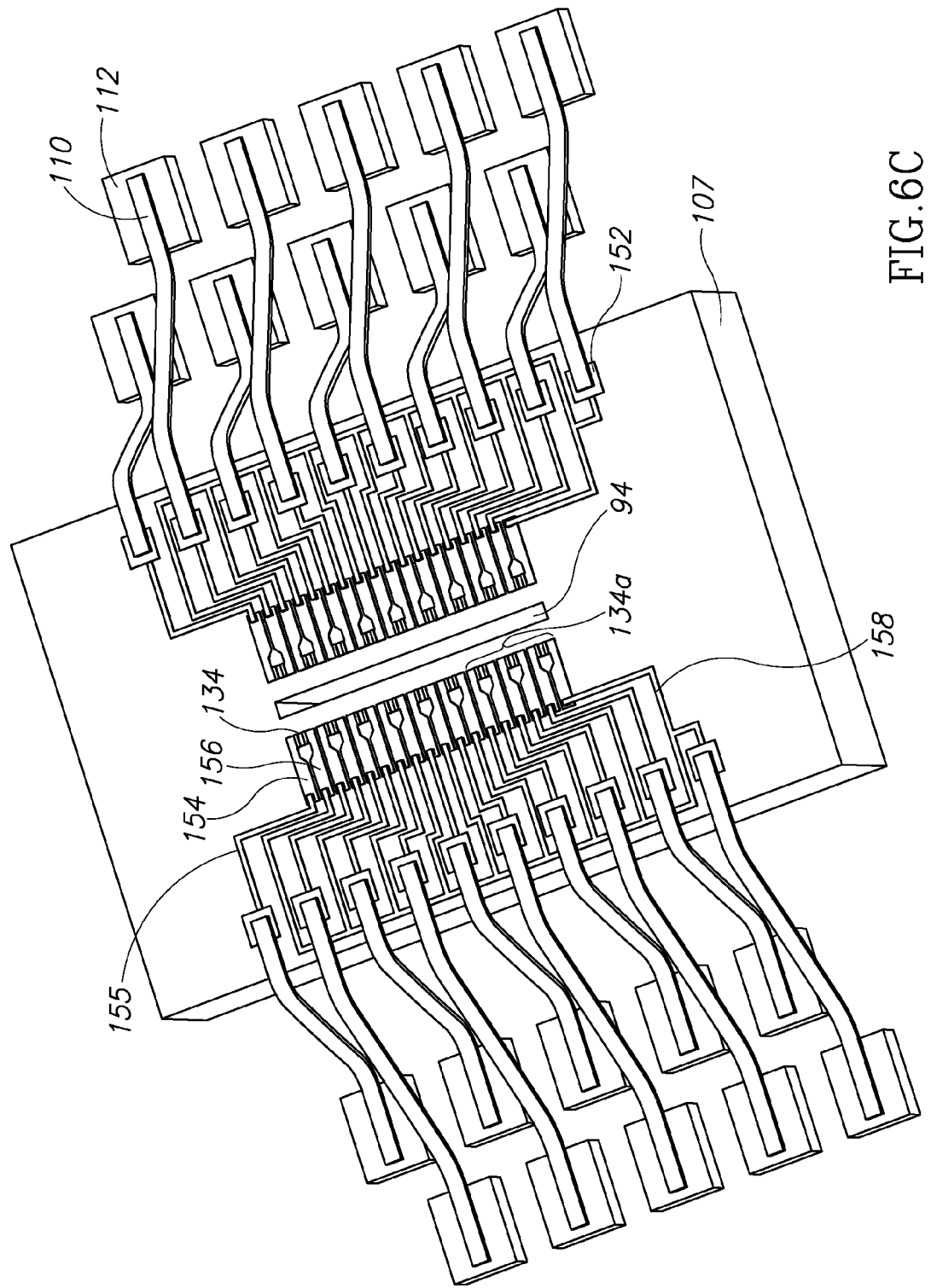

FIGS. 6A-6C include more details of the microfluidic die 92. The microfluidic die 92 includes a substrate 107, a plurality of intermediate layers 109, and a nozzle plate 132. The plurality of intermediate layers 109 include dielectric layers and a chamber layer 148 that are positioned between the substrate and the nozzle plate.

The die 92 includes a plurality of electrical connection leads 110 that extend from one of the intermediate dielectric layers 109 down to the contact pads 112 on the circuit board 106. Each lead 110 couples to a single contact pad 112 on the circuit board and to a single contact pad 152 on the die. Openings 150 on the left and right side of the die provide access to the intermediate layers 109 to which the leads are coupled. The openings 150 pass through the nozzle plate 132 and the chamber layer 148 to expose the contact pads 152 that are formed on the intermediate dielectric layers. In other embodiments that will be described below, there may be one opening 150 positioned on only one side of the die, such that all of the leads that extend from the die extend from one side while other side remains unencumbered by the leads.

In the illustrated embodiment, there are eighteen nozzles 130 through the nozzle plate 132, and nine nozzles on each side of a center line. FIG. 6B is a top down isometric view of the die 92 with the nozzle plate 132 removed, such that the chamber layer 148 is exposed. In some embodiments, the nozzle has a diameter between 20-30 microns. Each nozzle is in fluid communication with the fluid in the reservoir 50 by a fluid path that includes the first end 82 of the fluid transport member 80, through the transport member 80 to the second end 84, the chamber 88 above the second end 84 of the transport member, the first through hole 90 of the lid 54, the opening 78 of the PCB, through an inlet 94 of the die 92, then through a channel 126, and to the chamber 128, and out of the nozzle 130 of the die.

The die 92 includes an inlet path 94 that passes completely through the substrate 107 and interacts with the chamber layer 148 and the nozzle plate 132. The inlet path 94 is a rectangular opening; however, other shapes may be utilized according to the flow path constraints. The inlet path 94 is in fluid communication with the fluid path that passes through the opening 78 of the board 106 (see FIG. 4).

The inlet path 94 is coupled to a channel 126 (see FIGS. 7A-7B) that is in fluid communication with individual chambers 128, forming the fluid path. Above the chambers 128 is the nozzle plate 132 that includes the plurality of nozzles 130. Each nozzle 130 is above a respective one of the chambers 128. The die 92 may have any number of chambers and nozzles, including one chamber and nozzle. In the illustrated embodiment, the die includes eighteen chambers each associated with a respective nozzle. Alternatively, it can have ten nozzles and two chambers providing fluid for a group of five nozzles. It is not necessary to have a one-to-one correspondence between the chambers and nozzles.

Proximate each nozzle chamber is a heating element 134 (see FIGS. 6C and 8B) that is electrically coupled to and activated by an electrical signal being provided by one of the contact pads 152 of the die 92. Each heating element 134 is coupled to a first contact 154 and a second contact 156. The first contact 154 is coupled to a respective one of the contact pads 152 on the die by a conductive trace 155. The second contact 156 is coupled to a ground line 158 that is shared with each of the second contacts 156 on one side of the die. In one embodiment, there is only a single ground line that is shared by contacts on both sides of the die. Although FIG. 6C is illustrated as though all of the features are on a single layer, they may be formed on several stacked layers of dielectric and conductive material.

In use, when the fluid in each of the chambers 128 is heated by the heating element 134, the fluid vaporizes to create a bubble. The expansion that creates the bubble causes fluid to eject from the nozzle 130 and to form a droplet.

Returning to FIG. 5C, the traces 75 are coupled between the contact pads 112 and the contacts 74. In this embodiment, there are twenty contact pads, ten on each side of the die 92. Each contact pad 112 is coupled to one lead 110, which couples to one contact pad 152 on the die. There are eighteen nozzles in this die, which corresponds to eighteen heaters 134. Each heater is directly driven by one contact pad 152; however, several contact pads 112 are grouped together and driven simultaneously. In particular, there are three groups of three contact pads 112 on each side of the die 92. Each group of contact pads 112 is driven with a single trace 75. For example, contact 74a is coupled to group 112a, which will drive three heaters 134a (see FIG. 6C).

In this embodiment, there is a ground line 77a, 77b associated with each side of the die 92. Although there are two separate contacts 74b, 74c coupled to each ground line 77a, 77b, respectively, these two contacts could be a single contact. The total number of contacts 74 could be reduced to seven. It is to be understood that any number of nozzles and heaters could be driven together based on the voltage limitations of the system. As will be discussed in more detail below, dimensions of the board can be significantly reduced by reducing the number of contacts 74 that are included.

Having a contact 74 for each contact pad 112 consumes a large area on the circuit board 64. By driving several contact pads 112 in parallel, the number of traces 75 on the board 64 is reduced. This can allow the board to be manufactured to have a significantly smaller footprint.

In an alternative embodiment, the leads 110 extending from the die 92 may extend from a smaller side 93 of the die. The contact pads 112 would then be positioned between the opening 78 and the contacts 74. The traces that couple the contact pads 112 to the contacts 74 would then use less material and could allow the board to have a smaller width.

Figure 7A:
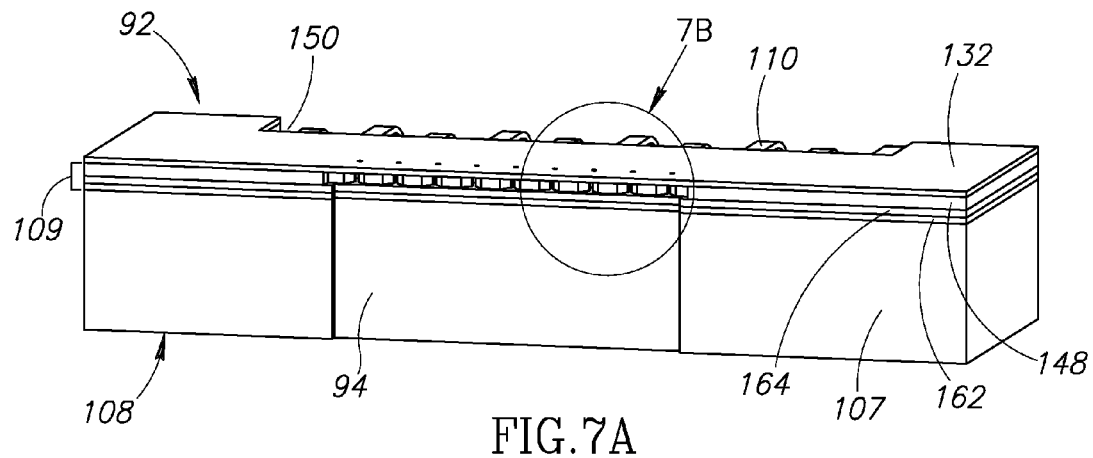
FIG. 7A is a cross-section view of line 7-7 in FIG. 6A.

FIG. 7A is a cross-section view through the die of FIG. 6A, through cut lines 7-7. As mentioned above, the substrate 107 includes the inlet path 94 through a center region associated with the chambers 128 and the nozzles 130. The inlet path is configured to allow fluid to flow up from the bottom surface 108 of the die into the channels, which couple to the nozzle chambers and heat the fluid to be ejected out of the nozzles.

The chamber layer 148 defines angled funnel paths 160 that feed the fluid from the channel 126 into the chamber 128. The chamber layer 148 is positioned on top of the intermediate dielectric layers 109. The chamber layer defines the boundaries of the channels and the plurality of chambers associated with each nozzle. In one embodiment, the chamber layer is formed separately in a mold and then attached to the substrate. In other embodiments, the chamber layer is formed by depositing, masking, and etching layers on top of the substrate.

The intermediate layers 109 include a first dielectric layer 162 and a second dielectric layer 164. The first and second dielectric layers are between the nozzle plate and the substrate. The first dielectric layer 162 covers the plurality of first and second contacts 154, 156 formed on the substrate, and covers the heaters 134 associated with each chamber. The second dielectric layer 164 covers the conductive traces 155.

Figure 7B:
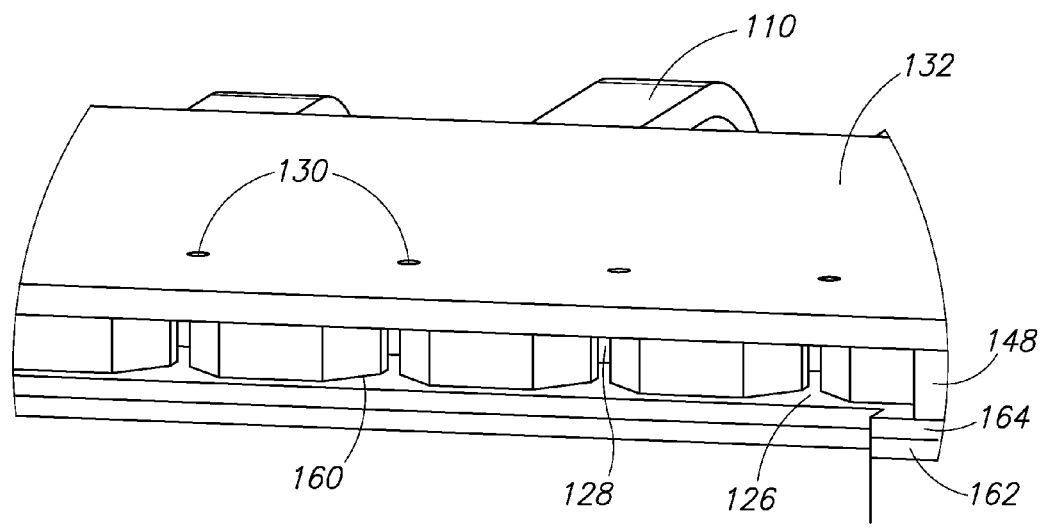
FIG. 7B is an enlarged view of a portion of FIG. 7A.

FIG. 7B is an enhanced view of a region of FIG. 7A. This enhanced view includes four nozzles formed in the nozzle plate, which are associated with four chambers positioned under each nozzle. The channel feeds fluid into each chamber through the funnel path.

Figure 8A:
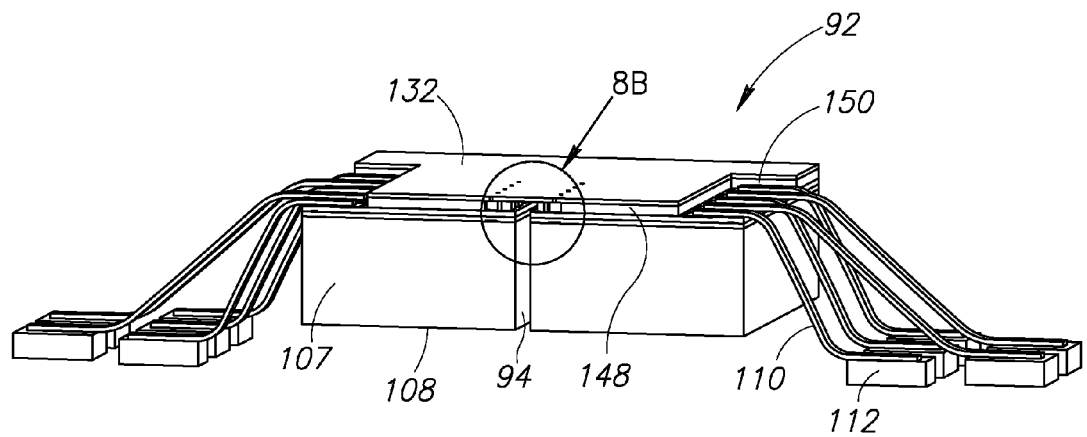
FIG. 8A is a cross-section view of line 8-8 in FIG. 6A.
Figure 8B:
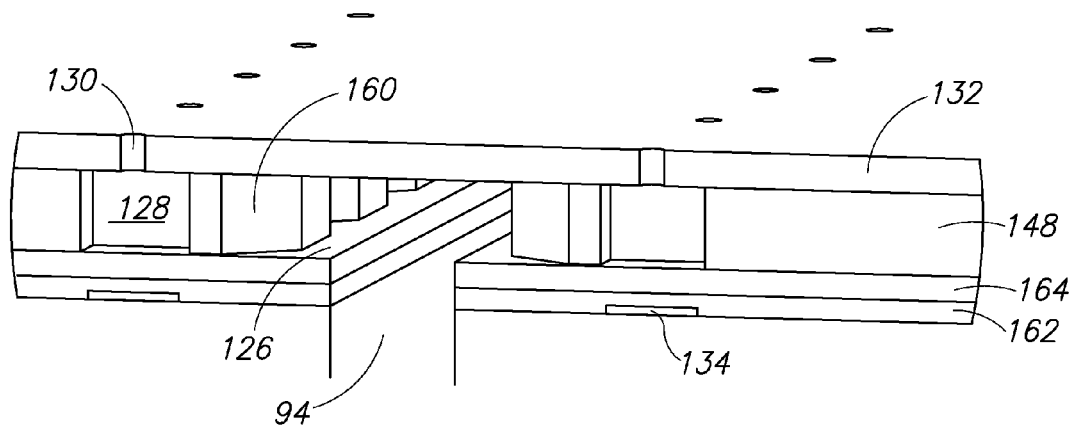
FIG. 8B is an enlarged view of a portion of FIG. 8A.

FIG. 8A is a cross-section view through the die along the cut line 8-8 of FIG. 6A. This cross-section is perpendicular to the cross-section of FIG. 7A. The inlet can be seen extending from the bottom surface of the die up to the channel. The inlet, as described above, allows fluid to flow from an external device, such as the cartridge described above. The inlet is in fluid communication with the channels and with the chambers, which are configured to eject the fluid through the nozzles in use. FIG. 8B is an enhanced cross-sectional view of a region of FIG. 8A. In this view, the heaters formed on the substrate are positioned below the chambers.

Figure 9A:
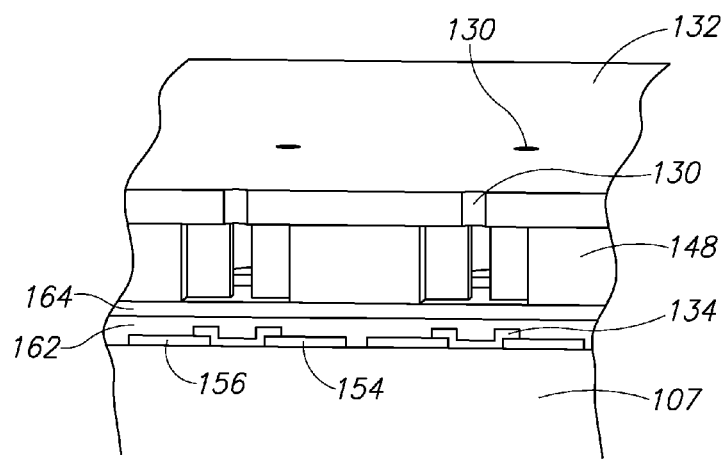
FIG. 9A is a cross-section view of line 9A-9A in FIG. 6A.

FIG. 9A is a cross-section view through the die along the cut line 9A-9A in FIG. 6A. The first and second contacts 154, 156 are formed on the substrate 107. The heaters 134 are formed to overlap with the first and second contacts 154, 156 of a respective heater assembly. The contacts 154, 156 may be formed of a first metal layer or other conductive material. The heaters 134 may be formed of a second metal layer or other conductive material. The heaters 134 are thin film resistors that laterally connect the first and second contacts 154, 156. In other embodiments, instead of being formed directly on a top surface of the contacts, the heaters may be coupled to the contacts through vias or may be formed below the contacts.

In one embodiment, the heater is a 20-nanometer thick tantalum aluminum layer. In another embodiment, the heater may include chromium silicon films, each having different percentages of chromium and silicon and each being 10 nanometers thick. Other materials for the heaters may include tantalum silicon nitride and tungsten silicon nitride. The heaters may also include a 30-nanometer cap of silicon nitride. In an alternative embodiment, the heaters may be formed by depositing multiple thin film layers in succession. A stack of thin film layers combine the elementary properties of the individual layers.

As shown in FIG. 6C, the contacts extend from the heaters 134 out to the traces 155. The first contact 154 provides power, while the second contact 156 is coupled to ground 158. As noted above, each of the heaters 134 on one side of the die are coupled to the same ground line 158. Alternatively, each of the heaters 134 on the die may be coupled to a single ground line to reduce the number of contact pads 152 on the die.

The first dielectric layer 162 covers the heaters and the contacts and the second dielectric layer 164 covers the first dielectric layer 162. The second dielectric layer 164 forms a bottom surface of the chamber 128. The thickness of the second dielectric layer 164 may be quite small to reduce a distance between the heater 134 and the chamber.

Figure 9B:
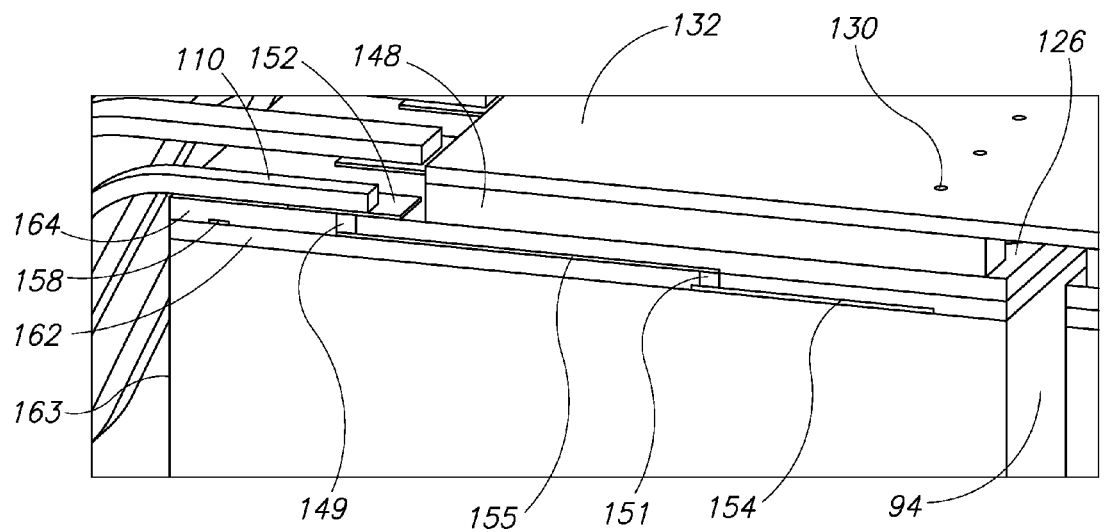
FIG. 9B is a cross-section view of line 9B-9B in FIG. 6A.

FIG. 9B is a cross-section view through the die along the cut line 9B-9B in FIG. 6A. A length of the first contact 154 can be seen adjacent to the inlet 94. A via 151 couples the first contact 154 to trace 155 that is formed on the first dielectric layer 162. The second dielectric layer 164 is on the trace 155. A via 149 is formed through the second dielectric layer 164 and couples the trace 155 to the contact pad 152. A portion of the ground line 158 is visible toward an edge 163 of the die, between the via 149 and the edge 163.

As can be seen in this cross-section, the die 92 is relatively simple and does not include complex integrated circuitry. This die 92 will be controlled and driven by an external microcontroller or microprocessor. The external microcontroller or microprocessor may be provided in the housing. This allows the board 64 and the die 92 to be simplified and cost effective.

This die 92 is a thermal heating die that is free of complicated active circuitry. In this embodiment, there are two metal or conductive levels formed on the substrate. These conductive levels include the contact 154 and the trace 155. In some embodiments, all of these features can be formed on a single metal level. This allows the die to be simple to manufacture and minimizes the number of layers of dielectric between the heater and the chamber.

Figure 10:
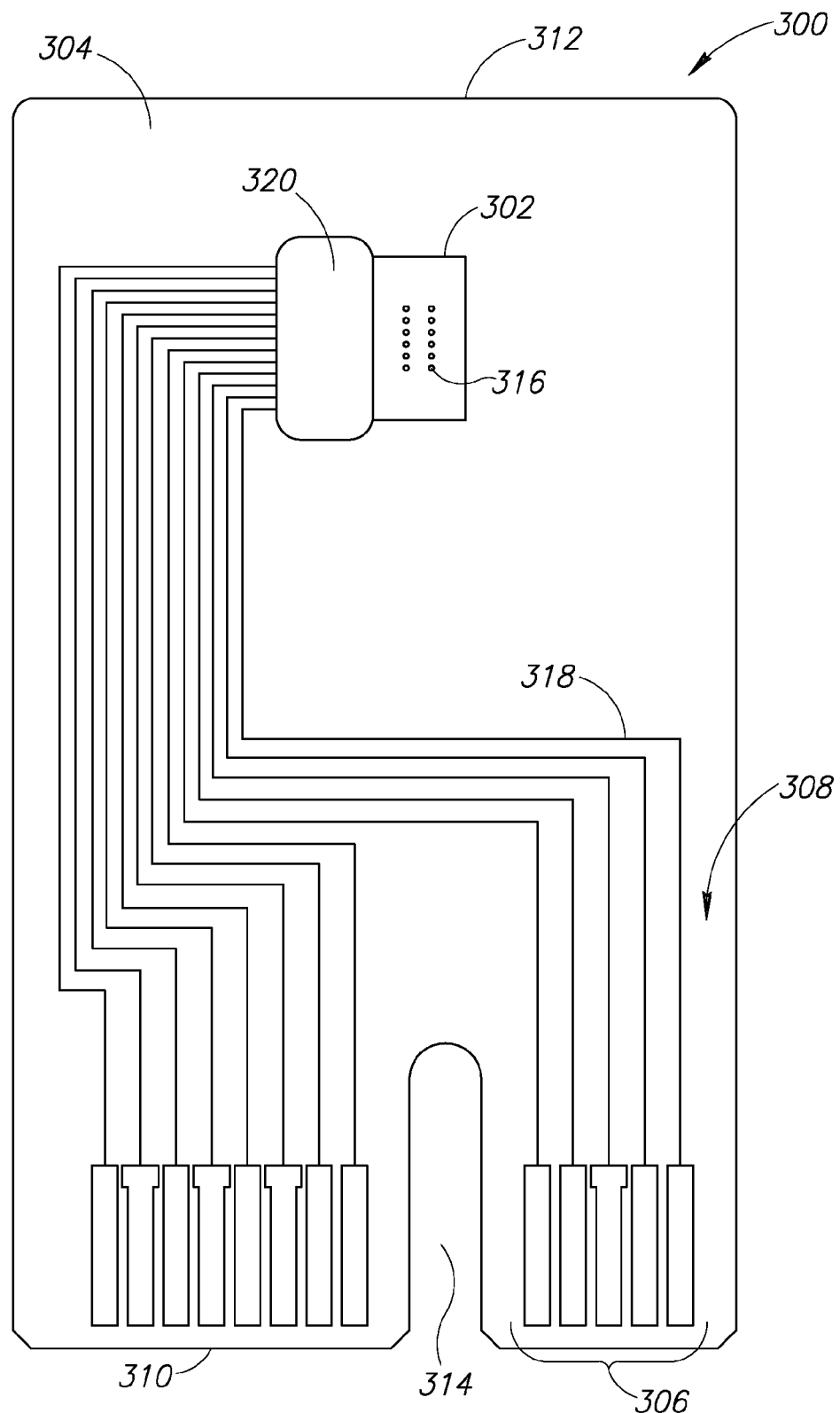
FIG. 10 is a top down view of an alternative embodiment of a printed circuit mounting system.

FIG. 10 is directed to another embodiment of the present disclosure and includes a printed circuit mounting system 300 for a thermal inkjet die 302. The die could be other types of ejector die, such as piezo ejection, ultrasonic ejection, and other mechanical ejection of a fluid. The mounting system includes a printed circuit board 304 formed of a composite material, such as woven fibers or other suitable layered material. One example of the composite material is FR4, which includes a plurality of bundles of fibers (see FIGS. 13 and 14). FR4 is a cheap and easily accessible material that can keep costs down so that the microfluidic delivery system 64 can be utilized in a variety of new environments, such as for ejecting scented oils vertically from the die. They may also be used in the medical field to vaporize medicine for a patient to inhale. Using the proposed microfluidic delivery system as described herein can give the patient or physician precise control over the rate and time of the dosage. For example, the physician could program the system 300 to vaporize the medicine for 20-second bursts spaced by 60 seconds without medicine for a period of time. Further, two or more die can be mounted side-by-side to deliver two or more different types of vapors to a patient using the same electronic controls.

The board 304 is a rigid material that provides consistent and reliable support for the die 320. The board 304 may alternatively be glass, silicon, or any other industry accepted standard circuit board. The board 304 includes a plurality of contact pads 306 on a top surface 308 positioned near a first end 310. The die 302 is positioned near a second end 312 that is opposite to the first end 310. There is a notch 314 in the first end 310 that provides guidance for insertion of the board into the housing and ensures it can only be inserted one way.

The die includes twelve nozzles 316 formed through nozzle plate. There are thirteen contact pads 306 that provide electrical control signals to dictate when the die ejects fluid. The contact pads 306 couple to the die through a plurality of traces 318 that are formed in the top surface of the board. Twelve of the contact pads 306 are connected to twelve heaters positioned underneath a chamber under each nozzle. The thirteenth contact pad is coupled to ground. Each of the heaters share the same ground line. If all nozzles will always eject fluid together, the control pads 306 can be only two, one power and one ground, that connect in parallel to all heaters. Alternatively, there can be two power pads 306 and two ground pads 306 that are electrically separate but driven together to provide back-up or redundancy to increase the reliability. The nozzles 316 can also be connected and driven as two banks.

An encapsulant 320 covers leads that extend from a layer of the die out to the surface of the board. In this embodiment, there is only encapsulant on one side of the die. It is beneficial to minimize the amount of encapsulant used because encapsulant can move around before it is cured into its final shape. If the encapsulant is too close to the nozzles, it can affect the performance of the nozzles. In order to have the encapsulant on one side of the die, each of the electrical paths through the die must be exposed from one side.

In one embodiment, the traces 318, the contact pads 306, and the contacts from the leads of the die are all formed in the same plane on the top surface of the board. In addition, the bottom surface of the die may rest in the same plane such that the nozzles are in a plane parallel to the plane of the leads, contacts, and contact pads.

In one embodiment, the die 92 includes active circuitry including transistors, resistors, capacitors, and other features that are configured to drive the heaters and eject fluid out of the nozzles. In other embodiments, the die 92 does not include any active circuitry and only includes electrical connections to the heaters. This other embodiment will be controlled and driven by a controller that is spaced from the die and is also spaced from the board 106.

Figure 11:
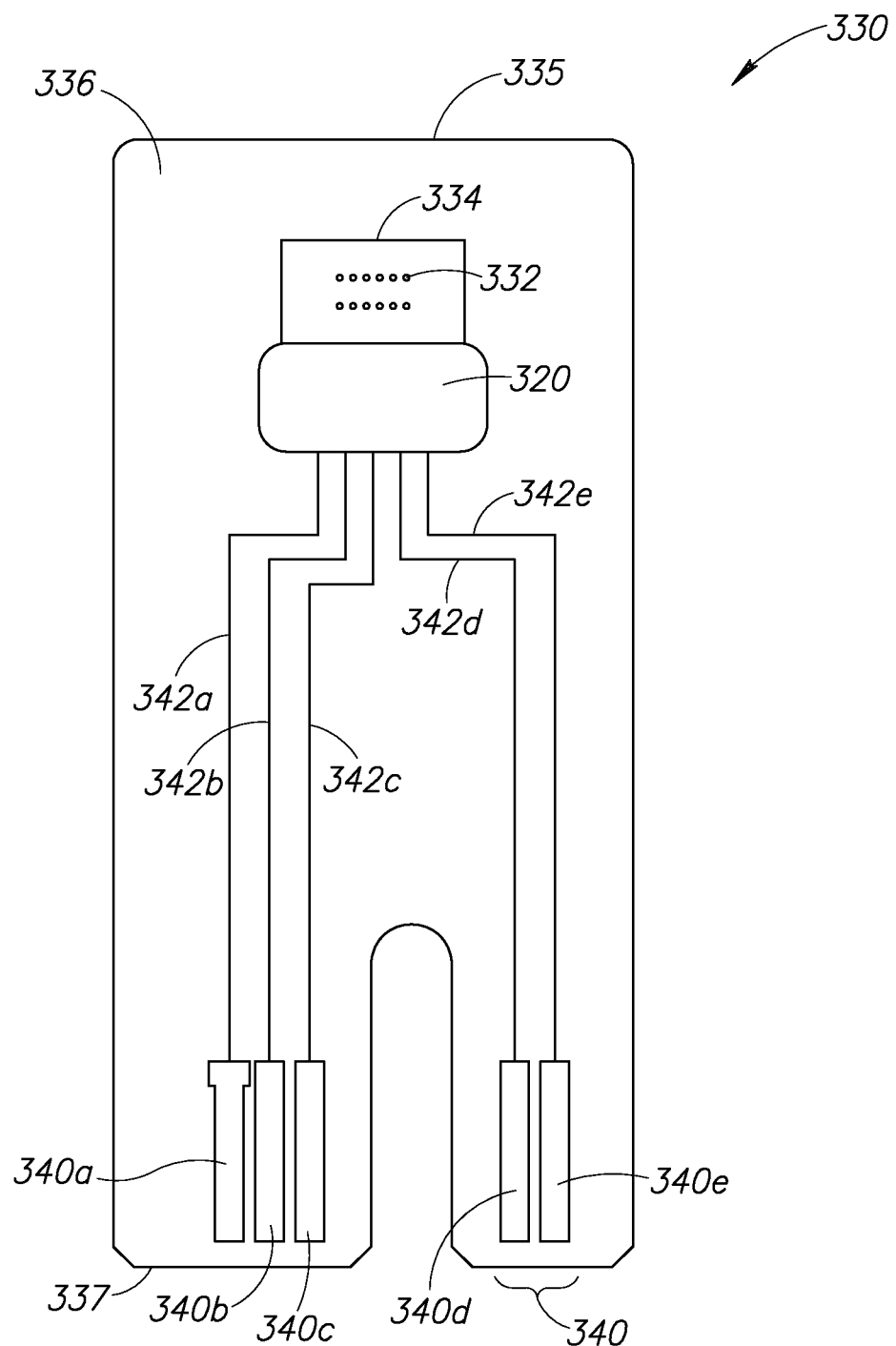
FIG. 11 is a top down view of an alternative embodiment of a microfluidic delivery member.

FIG. 11 is an alternative embodiment of a microfluidic delivery member 330. This delivery member is significantly smaller in length and width than the board of FIG. 10. This smaller footprint allows the housing and lid to be smaller to utilize this technology in a variety of size constrained environments.

This decrease in size is related to arranging groups of nozzles to be driven in parallel. For example, in this embodiment there are twelve nozzles 332 on a die 334. The die is coupled to a first end 335 of a board 336 that includes five contacts 340 at a second end of the board 337. The five contacts are coupled to the die 334 through a plurality of traces 342a-342e.

The five contacts include four power delivering contacts 340a, 340b, 340c, 340d and one ground contact 340e. The power delivering contacts 340a, 340b, 340c, 340d each provide the same voltage, but provide pulses at different times. A controller that is not coupled to the board provides the pulses and controls when each nozzle ejects fluid.

Since there are four power delivering contacts 340a, 340b, 340c, 340d, the nozzles are broken into four groups of three. Each group of three will fire simultaneously, such that each heater associated with each nozzle of the group of three nozzles will receive power at the same time and heat the fluid simultaneously.

The controller may fire each group of three consecutively so that a maximum amount of current can be sent to each group. This also allows the chambers of a recently fired group to refill and be ready to eject when the pulse returns to that group of three nozzles. In one embodiment, the controller will output a two-microsecond pulse to a first one of the power delivering contacts 340a. Then, the controller will output a two-microsecond pulse to a second one of the power delivering contacts 340b, and so forth, until the controller returns to the first one of the power delivering contacts 340a. This configuration will eject three drops for every two-microsecond pulse. The number of nozzles that can be driven in parallel can vary and is limited by the power supply of the system.

Figure 12:
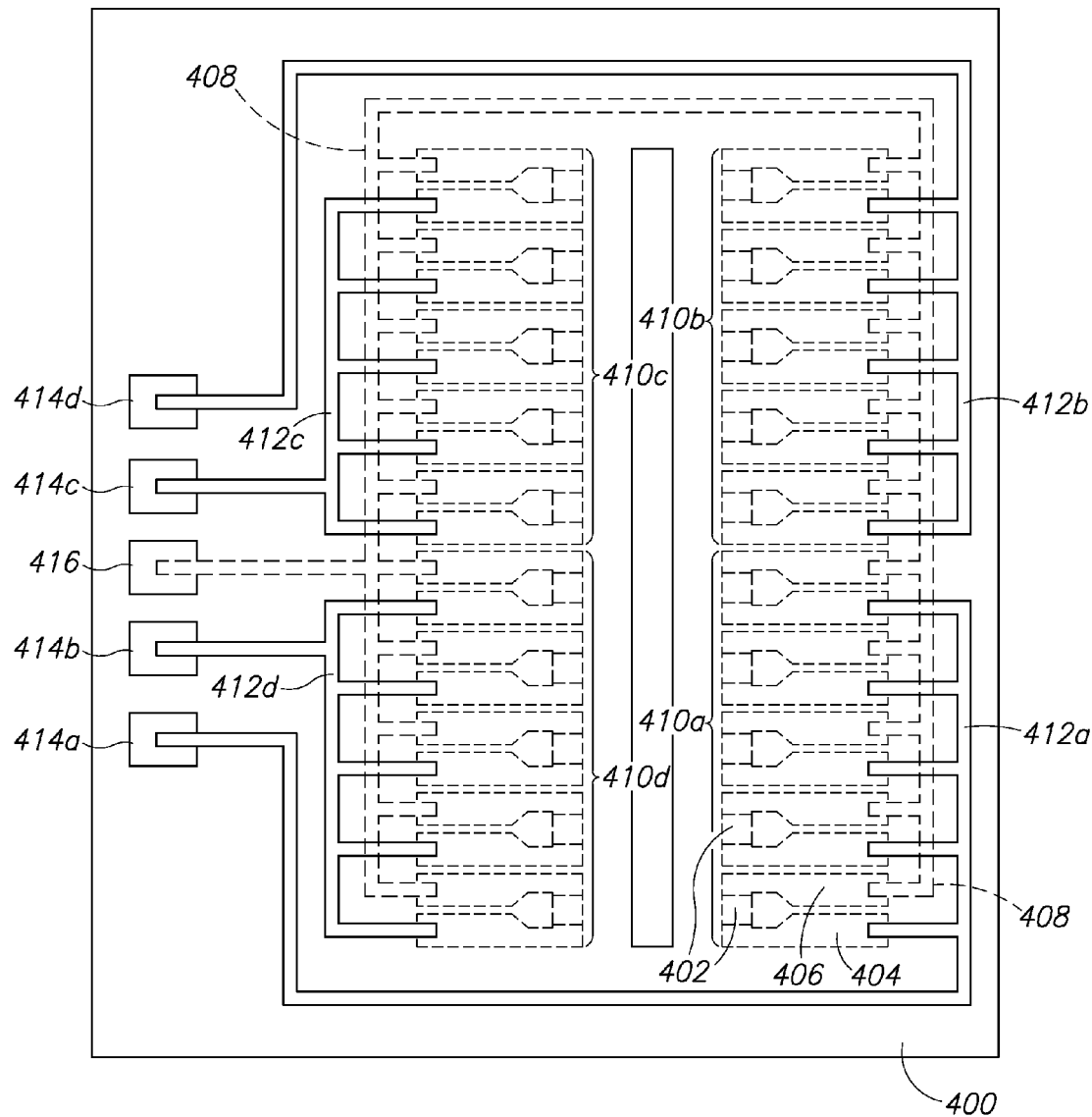
FIG. 12 is a top down view of an alternative embodiment of a microfluidic die according to an embodiment.

FIG. 12 is a top down view of an alternative embodiment of a die 400 according to the present disclosure. This die 400 is incomplete in that the chambers and the nozzles have not been illustrated. The chambers and nozzles described in detail with respect to FIGS. 6A-6C, 7A-7B, and 8A-8B may be used with this die 400.

The die includes a plurality of heaters 402. Each heater includes an input contact 404 and an output contact 406. Each output contact 406 is coupled to a single ground line 408. In one embodiment, the input and output contacts 406 are formed as part of a same metal or conductive level as the single ground line 408; however, in other embodiments, the input and output contacts 406 are formed as part of a different metal or conductive level as the single ground line 408.

In this embodiment, there are twenty heaters, which are configured to heat twenty different chambers and eject fluid from twenty nozzles. The twenty heaters are grouped in to groups of five heaters that are all driven by a single signal from a single line. For example, there are four groups 410a, 410b, 410c, 410d of five heaters 402. There are four signal lines 412a, 412b, 412c, 412d each coupled to one of the four groups 410a, 410b, 410c, 410d of heaters. The single ground line may be supplied with a positive voltage while the other four signal lines 412a, 412b, 412c, 412d receive a lower voltage.

Each of the signal lines 412a, 412b, 412c, 412d is coupled to a separate contact pad 414a, 414b, 414c, 414d, which is coupled to an external power source. The single ground line 408 is coupled to another contact pad 416. A via (not shown) may couple the single ground line 408 to the contact pad 416. A plurality of different vias (not shown) may couple the four signal lines 412a, 412b, 412c, 412d to the input contacts 404.

These twenty nozzles are driven by five contact pads, one of which is ground. This greatly simplifies the manufacturing steps to form this die, which can reduce cost and the overall footprint of the die. In addition, five drops are formed from five chambers at the same time. It is to be noted that the number of heaters that are driven together can vary based on the demands of the system in which the die is installed. Ejecting multiple drops at the same time can enhance the plume created by the vertically oriented nozzles.

In some embodiments, this system may be configured to eject a fluid that has been mixed with ethanol or some other volatile additive. The ethanol helps each drop to evaporate as it moves vertically away from the die once ejected. This also prevents the fluid from falling back on to a top surface of the die and clogging the nozzles. If the ethanol is mixed with a scented oil, the scented oil is released into the air when the ethanol evaporates. By ejecting multiple drops at the same time, the evaporation of the drops can extend a height of a plume formed from the drops. A single ejected drop will have a much smaller plume than a plurality of drops ejected together. The ethanol increases the vapor pressure, which in turn creates a more powerful ejection.

In this disclosure, nozzles can be ganged together in parallel such that an individual electrical pulse through a set of bond pads will fire multiple nozzles concurrently. This increases the current load of a drive system and eliminates discrete nozzle control. Decreasing the number of bond pads allows the die size and substrate size to decrease, reducing cost. In the preferred embodiment, five nozzles are ganged together for simultaneous firing. If there are twenty total nozzles with five nozzles grouped together, only five bond pads, one ground and four signal lines are utilized. This can result in a die size reduction of 50%. The reduction of bond pads means a reduction in the electro-mechanical interconnect on an associated board, which corresponds to a reduction in the cost of a connector that couples the board to the housing.

In one embodiment, each heater will use around 150-200 milliamp. The current for five heaters may be around 750 milliamp-1 amp. These groups of five heaters may be fired in sequence at 5 khz per group.

Figure 15:
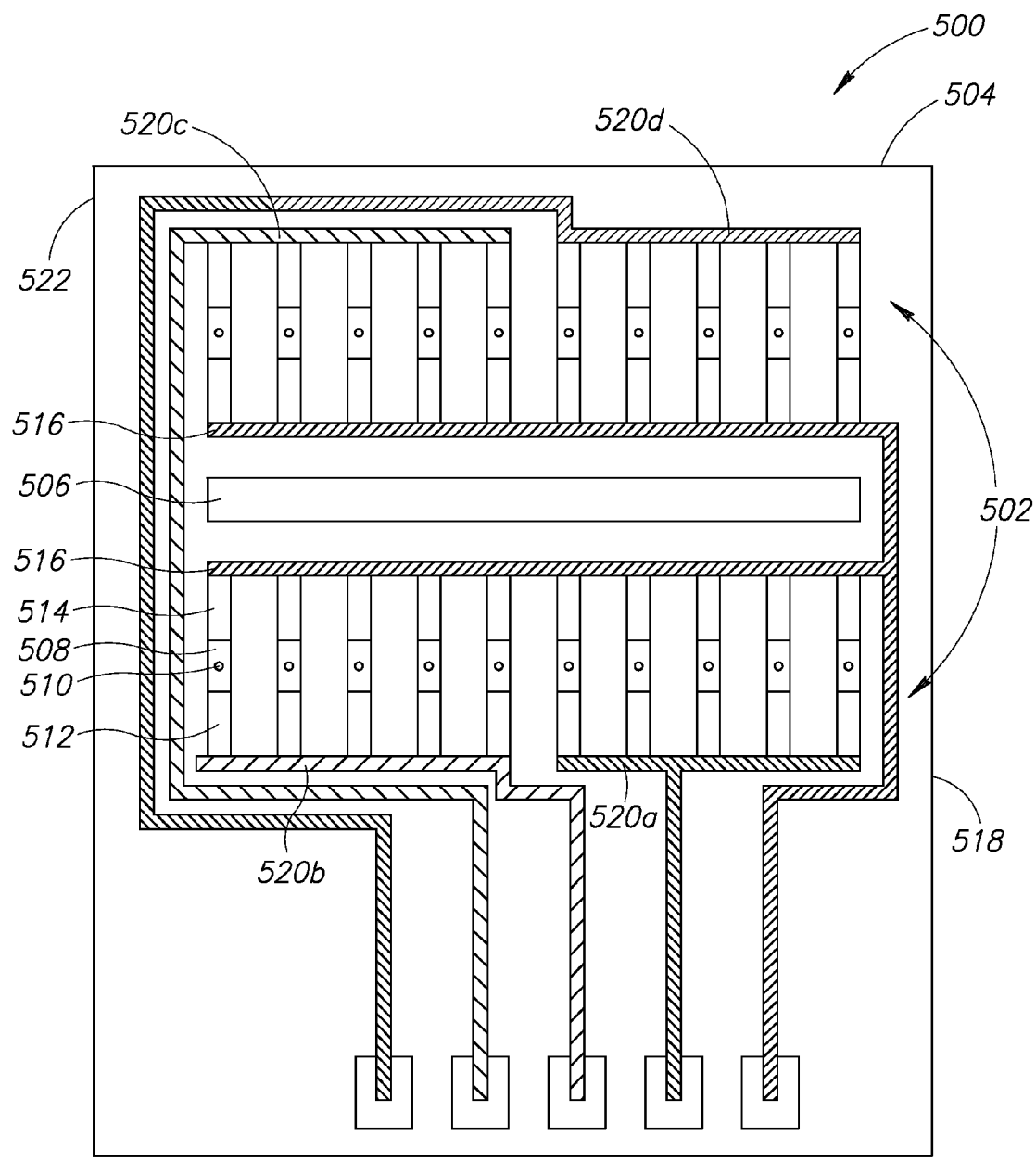
FIG. 15 is a top down view of an alternative embodiment of a microfluidic die according to an embodiment.

FIG. 15 is yet another embodiment of a portion of a die 500 formed in accordance with the present disclosure. This die 500 includes a single metal or conductive level from which all electrical components of a heating system 502 are formed. The heating system 502 is formed on a substrate 504. There is an inlet path 506 through the substrate 504 that is configured to allow fluid to flow from a reservoir up to chambers formed above the substrate. The chambers are not shown in this embodiment. Chambers similar to the chambers described above may be utilized with this die 500.

The heating system 502 also includes a plurality of heaters 508. A nozzle 510 is shown positioned centrally with respect to the heater; however, the nozzles is simply a reference of the nozzle position. The actual nozzles are not shown because no nozzle plate is included in this view. The nozzle plate has been omitted so that the single metal level is visible without overlapping features from the chambers and nozzles.

Each heater 508 includes an input contact 512 and an output contact 514. All of the output contacts 514 are coupled together and are coupled to a single ground trace 516. The single ground trace 516 is positioned between the heaters 508 and the inlet path 506. The ground trace 516 extends along a first edge 518 of the die.

The plurality of heaters are driven in groups of five such that there are four input traces 520a, 520b, 520c, 520d. The input traces 520c and 520d extend along a second edge 522 of the die.

In one embodiment, the ground trace 516 may be positioned directly under the funnel paths 160 that feed the chamber. There may be an extended flow path between the funnel path and the chamber. For example, in FIG. 6B, the narrow portion between the funnel path and the chamber may be elongated and the ground trace may pass beneath the narrow portion. A length of the ground trace is perpendicular to a length of the narrow portion.

Figure 16:
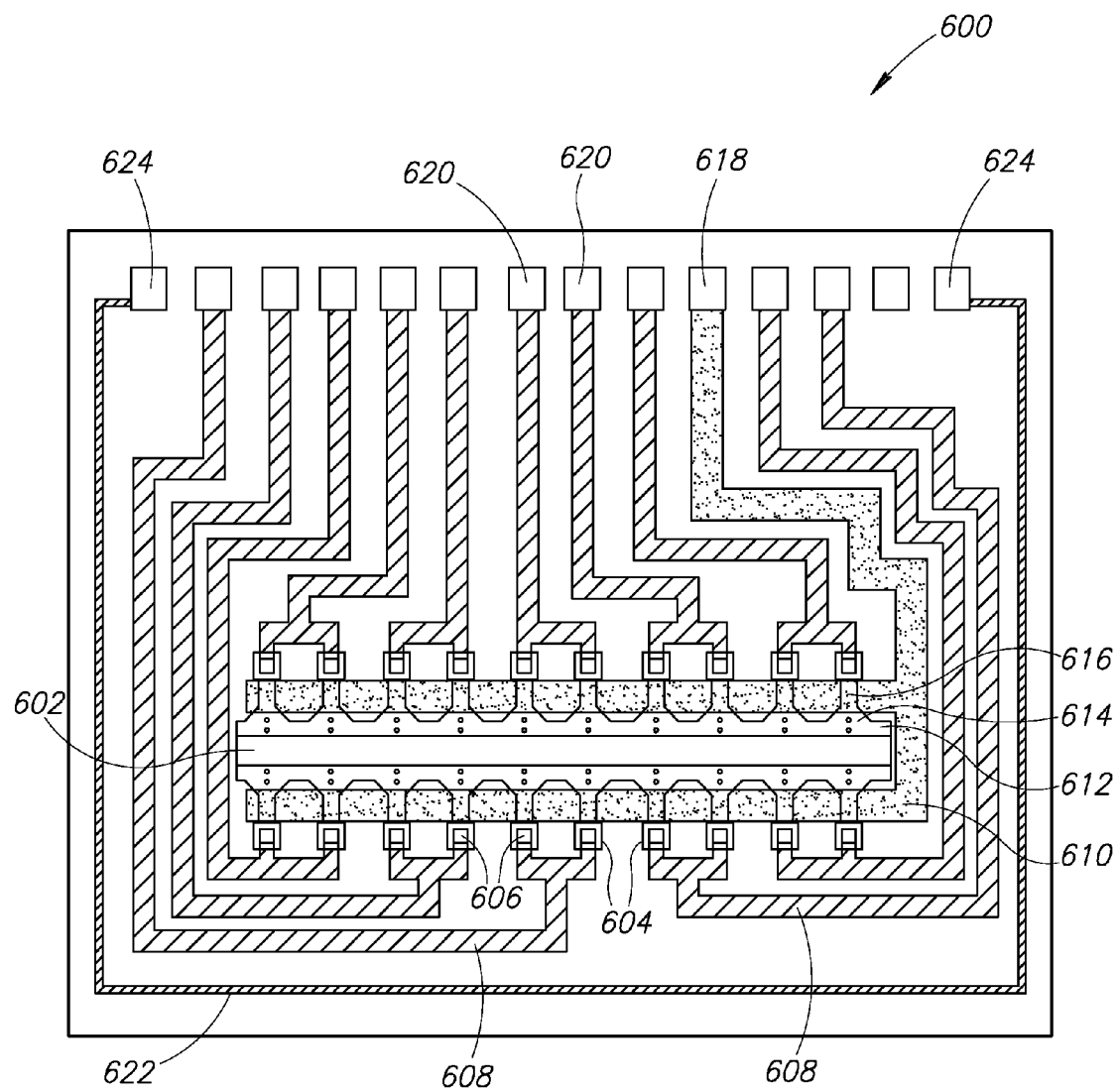
FIG. 16 is an alternative embodiment of a microfluidic die according to the present disclosure.

FIG. 16 is an alternative embodiment of a microfluidic die 600 that includes an inlet path 602 that is configured to move fluid from a reservoir to a plurality of chambers 604. A plurality of heaters 606 are positioned adjacent to a bottom surface of the chamber 604 to heat the fluid and eject the fluid from the chamber. This die is configured to be used with any number of fluids that may be selected by a user. The die is configured to eject fluid vertically, such that it may be utilized to eject a scented fluid or a medication.

The fluid moves through the inlet path 602 to a channel region 612, through a funnel region 614, into a narrow flow path 616, and then into the chamber 604. The flow path 616 is narrower in width than the chamber and narrower than a widest part of the funnel region 614.

Each of the heaters 606 are coupled to power lines 608 and a ground line 610. Each of the heaters 606 share the same ground line 610, which overlaps the narrow flow path 616 that leads to the chambers. In this embodiment, there is one contact 618 for ground. There are ten power contacts 620. There are twenty heaters 606, which are each associated with a nozzle (not shown). Each heater is paired with an adjacent heater and coupled to one of the power lines 608. This way pairs of heaters are driven at the same time by a single power contact 620. In an alternative embodiment, the uncoupled contact pad may be a second ground contact.

This die may be coupled to a circuit board, such as the boards described above. It is possible that two of the power contacts 620, and thus four heaters, may be coupled to a single contacts pad of the board. Accordingly, four heaters would be driven at the same time and four drops would be ejected at the same time.

A thermal sense resistor (TSR) 622 may be included around an edge of the die 600 and may be coupled to a pair of contact pads 624. The TSR is measured to calculate the temperature of the die. The thermal sense resistor may use a common ground with the rest of the die, however, that creates more noise on the signal that is sensed. The sense resistor is read between firing pulses so there is no overlap of signals. The sense resistor is generally run as a serpentine to increase the number of squares and therefore increase the sensitivity of the measurement.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a microfluidic die including:
  a substrate;
  a plurality of heaters on the substrate;
  a plurality of nozzles aligned with the plurality of heaters;
  a first plurality of electrical traces, each of the first plurality of electrical traces being coupled to one of the plurality of heaters;
  a second plurality of electrical traces, each of the second plurality of electrical traces being coupled to one of the plurality of heaters and coupled to each other;
  a plurality of contact pads;
  a first signal line coupled to each of the second plurality of electrical traces and to a first one of the plurality of contact pads;
  a plurality of second signal lines, each second signal line being coupled to a subset of the second plurality of electrical traces, each of the second signal lines being configured to drive one of the subsets of the plurality of heaters with a single signal, each of the plurality of second signal lines being coupled to a remaining one of the plurality of contact pads.

2. The device of claim 1 wherein the first plurality of electrical traces, the second plurality of electrical traces, the first signal line, and the plurality of second signal lines are all formed on a single metal level.

3. The device of claim 1 wherein the first plurality of electrical traces, the second plurality of electrical traces, and the first signal line are all formed on a first metal level, and the plurality of second signal lines are formed on a second metal level.

4. The device of claim 1 wherein the die includes:
 an inlet path;
 a plurality of chambers positioned between the plurality of heaters and the plurality of nozzles; and
 a channel between the inlet path and the chambers.

5. The device of claim 4 wherein the first signal line is positioned between the inlet path and the plurality of chambers.

6. The device of claim 5 wherein the second plurality of electrical traces are separated from the first signal line by the plurality of chambers.

7. A microfluidic die, comprising:
 a substrate;
 a first contact pad on the substrate;
 a second contact pad on the substrate;
 a first group of heaters on the substrate, each heater having an input terminal and an output terminal;
 a first signal line electrically coupled to each of the input terminals of the first group of heaters, the first signal line being coupled to the first contact pad; and
 a second signal line electrically coupled to each of the output terminals of the first group of heaters, the second signal line being coupled to the second contact pad.

8. The microfluidic die of claim 7 wherein the input terminals and the output terminals of the first group of heaters, the first signal line, and the second signal line are formed on a single metal level.

9. The microfluidic die of claim 7 wherein the input terminals and the output terminals of the first group of heaters, and the first signal line are formed on a first metal level, and the second signal line is formed on a second metal level.

10. The microfluidic die of claim 7, further comprising:
a third contact pad on the substrate;
a second group of heaters on the substrate, each heater having an input terminal and an output terminal, the input terminals of the second group of heaters being coupled to the first signal line; and
a third signal line coupled to the output terminals of the second group of heaters, the third signal line being coupled to the third contact pad.

11. The microfluidic die of claim 7, further comprising:
an inlet path;
a first group of nozzles aligned with the first group of heaters;
a plurality of chambers positioned between the first group of heaters and the first group of nozzles; and
a channel between the inlet path and the plurality of chambers.

12. The microfluidic die of claim 11 wherein the first signal line is positioned between the inlet path and the plurality of chambers.

13. A microfluidic die, comprising:
a substrate;
a plurality of heaters on the substrate;
a plurality of nozzles aligned with the plurality of heaters;
a first metal level on the substrate, the first metal level including:
  a first plurality of traces electrically coupled to a respective heater of the plurality of heaters;
  a second plurality of traces electrically coupled a respective heater of the plurality of heaters; and
  a first signal line electrically coupled to each of the first plurality of traces;
a plurality of contact pads; and
a second metal level that includes:
  a plurality of second signal lines, each of the plurality of second signal lines being electrically coupled to a subset of the second plurality of traces, each of the plurality of second signal lines and the first signal line being coupled to one of the plurality of contact pads.

14. The microfluidic die of claim 13, further comprising:
an inlet path;
a plurality of chambers positioned between the plurality of heaters and the plurality of nozzles; and
a channel between the inlet path and the plurality of chambers.

15. The microfluidic die of claim 14 wherein the first signal line is positioned between the inlet path and the plurality of chambers.

16. The microfluidic die of claim 15 wherein the second plurality of traces are separated from the first signal line by the plurality of chambers.

17. A microfluidic die, comprising:
a substrate;
a plurality of heaters on the substrate;
a plurality of nozzles aligned with the plurality of heaters;
a plurality of chambers positioned between the plurality of heaters and the plurality of nozzles;
an inlet path;
a channel between the inlet path and the plurality of chambers;
a first plurality of traces electrically coupled to one of the plurality of heaters;
a second plurality of traces electrically coupled to one of the plurality of heaters;
a plurality of contact pads;
a first signal line electrically coupled to the first plurality of traces, the first signal line being positioned between the inlet path and the plurality of chambers; and
a plurality of second signal lines, each of the plurality of second signal lines being electrically coupled to a subset of the second plurality of traces, each of the plurality of second signal lines and the first signal line being coupled to one of the plurality of contact pads.

18. The microfluidic die of claim 17 wherein the first plurality of traces are separated from the first signal line by the plurality of chambers.

* * * * *